(12) United States Patent
Wei et al.

(10) Patent No.: US 11,508,847 B2
(45) Date of Patent: Nov. 22, 2022

(54) TRANSISTOR ARRANGEMENTS WITH METAL GATE CUTS AND RECESSED POWER RAILS

(71) Applicant: Intel Corporation, Santa Clara, CA (US)

(72) Inventors: Andy Chih-Hung Wei, Yamhill, OR (US); Sean T. Ma, Portland, OR (US); Piyush Mohan Sinha, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/812,428

(22) Filed: Mar. 9, 2020

(65) Prior Publication Data
US 2021/0280708 A1    Sep. 9, 2021

(51) Int. Cl.
| | |
|---|---|
| *H01L 29/78* | (2006.01) |
| *H01L 21/8234* | (2006.01) |
| *H01L 29/66* | (2006.01) |
| *H01L 29/417* | (2006.01) |
| *H01L 29/06* | (2006.01) |

(52) U.S. Cl.
CPC .... *H01L 29/785* (2013.01); *H01L 21/823431* (2013.01); *H01L 29/0649* (2013.01); *H01L 29/41791* (2013.01); *H01L 29/66795* (2013.01)

(58) Field of Classification Search
CPC ............. H01L 21/762; H01L 21/76224; H01L 21/823431; H01L 27/0886; H01L 29/0649; H01L 29/0653; H01L 29/41791; H01L 29/42372; H01L 29/42376; H01L 29/4238; H01L 29/66545; H01L 29/66795; H01L 29/785; H01L 29/7851; H01L 29/7855
See application file for complete search history.

(56) References Cited

U.S. PATENT DOCUMENTS

| | | |
|---|---|---|
| 10,020,381 B1 | 7/2018 | Fan et al. |
| 2018/0040719 A1 | 2/2018 | Wang et al. |
| 2018/0053694 A1* | 2/2018 | Cheng ................. H01L 21/022 |
| 2018/0069000 A1* | 3/2018 | Bergendahl ......... H01L 27/0924 |
| 2018/0261514 A1* | 9/2018 | Xie ...................... H01L 29/517 |
| 2018/0294267 A1 | 10/2018 | LiCausi et al. |

(Continued)

FOREIGN PATENT DOCUMENTS

EP    3671825 A1    6/2020

*Primary Examiner* — Shaun M Campbell
(74) *Attorney, Agent, or Firm* — Akona IP PC

(57) ABSTRACT

Described herein are transistor arrangements fabricated by forming a metal gate cut as a trench that is non-selective to the gate sidewalls, in an etch process that can remove both the gate electrode materials and the surrounding dielectrics. Such an etch process may provide improvements in terms of accuracy, cost-efficiency, and device performance, compared to conventional approaches to forming metal gate cuts. In addition, such a process may be used to provide power rails, if the trench of a metal gate cut is to be at least partially filled with an electrically conductive material. Because the electrically conductive material is in the trench and may be in between the fins, as opposed to being provided over the fins, such power rails may be referred to as "recessed." Providing recessed power rails may provide improvements in terms of reduced metal line resistance and reduced voltage droop.

20 Claims, 21 Drawing Sheets

(56) References Cited

U.S. PATENT DOCUMENTS

| | | | |
|---|---|---|---|
| 2018/0350810 A1* | 12/2018 | Bergendahl | H01L 21/823437 |
| 2019/0013246 A1* | 1/2019 | Wallace | H01L 21/3086 |
| 2019/0067277 A1* | 2/2019 | Tsai | H01L 21/823821 |
| 2019/0067290 A1 | 2/2019 | Wang et al. | |
| 2019/0067417 A1* | 2/2019 | Ching | H01L 29/0653 |
| 2019/0164805 A1 | 5/2019 | Chou et al. | |
| 2019/0164837 A1* | 5/2019 | Hung | H01L 29/66545 |
| 2019/0164839 A1* | 5/2019 | Tsai | H01L 21/823437 |
| 2019/0165178 A1 | 5/2019 | Chen et al. | |
| 2019/0348516 A1 | 11/2019 | Ramaswamy et al. | |
| 2020/0006075 A1* | 1/2020 | Wang | H01L 21/823468 |
| 2020/0075428 A1* | 3/2020 | Venigalla | H01L 21/823821 |
| 2020/0083222 A1* | 3/2020 | Kim | H01L 29/66545 |
| 2020/0098681 A1 | 3/2020 | Kim et al. | |
| 2020/0105603 A1 | 4/2020 | Chang et al. | |
| 2020/0135578 A1 | 4/2020 | Ching et al. | |
| 2020/0176318 A1* | 6/2020 | Jang | H01L 21/31116 |
| 2021/0074697 A1* | 3/2021 | Baek | H01L 29/78696 |
| 2021/0098309 A1* | 4/2021 | Min | H01L 21/823481 |
| 2021/0098471 A1* | 4/2021 | Chen | H01L 21/76877 |
| 2021/0134722 A1* | 5/2021 | Zhang | H01L 21/823475 |

\* cited by examiner

TRANSISTOR ARRANGEMENTS WITH METAL GATE CUTS AND RECESSED POWER RAILS

TECHNICAL FIELD

This disclosure relates generally to the field of semiconductor devices, and more specifically, to field-effect transistors (FETs).

BACKGROUND

A FET, e.g., a metal-oxide-semiconductor (MOS) FET (MOSFET), is a three-terminal device that includes source, drain, and gate terminals and uses electric field to control current flowing through the device. A FET typically includes a semiconductor channel material, a source and a drain regions provided in the channel material, and a gate stack that includes at least a gate electrode material and may also include a gate dielectric material, the gate stack provided over a portion of the channel material between the source and the drain regions. Because gate electrode materials often include metals, gates of transistors are commonly referred to as "metal gates."

Recently, FETs with non-planar architectures, such as FinFETs (also sometimes referred to as "wrap-around gate transistors" or "tri-gate transistors") and nanoribbon/nanowire transistors (also sometimes referred to as "all-around gate transistors"), have been extensively explored as alternatives to transistors with planar architectures.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
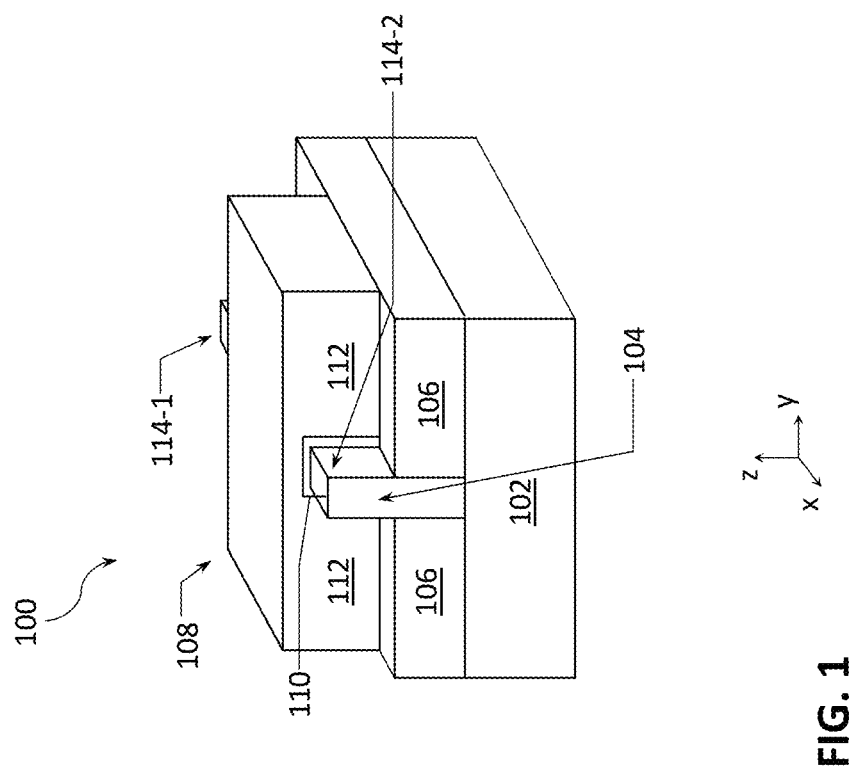
FIG. 1 is a perspective view of an example FinFET, according to some embodiments of the disclosure.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating transistor arrangements with metal gate cuts and recessed power rails, proposed herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of transistors being implemented as FinFETs, embodiments of the present disclosure are equally applicable to transistor arrangements employing transistors of other architectures, such as nanoribbon or nanowire transistors.

As described above, recently, FETs with non-planar architectures, such as FinFETs and nanoribbon/nanowire transistors, have been extensively explored as alternatives to transistors with planar architectures.

In a FinFET, a semiconductor structure shaped as a fin extends away from a base (e.g., from a semiconductor substrate), and a gate stack wraps around the upper portion of the fin (i.e., the portion farthest away from the base), forming a gate on 3 sides of the fin. The portion of the fin around which the gate stack wraps around is referred to as a "channel" or a "channel portion" of a FinFET. A semiconductor material of the channel portion is commonly referred to as a "channel material" of the transistor. A source region and a drain region are provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel portion" of a nanoribbon transistor is the portion of the nanoribbon around which the gate stack wraps around. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular transverse cross-section.

Taking FinFETs as an example, oftentimes, fabrication of an IC device having an array of FinFETs involves, first, providing a plurality of fins (typically parallel to one another), and then providing metal gate lines that cross over multiple fins (the metal gate lines often, but not always, being substantially perpendicular to the length of the fins, the metal gate lines provided in a plane substantially parallel to the plane of the support structure on which the fins are formed). A metal gate line crossing a first fin of the plurality of fins may form a gate of a transistor in the first fin, while the metal gate line crossing an adjacent second fin may form a gate of a transistor in the second fin. Since the metal gate line crosses over both the first and the second fins, the metal gate line is electrically continuous over the first and second fins, thereby providing an electrical coupling between the gate of the transistor in the first fin and the gate of the transistor in the second fin. In a later part of a fabrication process, it may be desirable to disrupt this continuity, e.g., if the design is such that it requires that the gate of the transistor in the first fin is decoupled from the gate of the transistor in the second fin.

As the dimensions of IC devices are ever-decreasing, disrupting the electrical continuity of a metal gate line (a process commonly referred to as a "metal gate cut") to decouple gates of transistors on adjacent fins in a manner that is sufficiently accurate, cost-efficient, and does not inadvertently compromise performance of an IC device is far from trivial. One conventional approach includes using a combination of masks and etch-selective materials (i.e., materials that are etched by different etchants) to selectively etch the gate electrode materials in areas where the metal gate line is to be disrupted. Selective etch is typically an isotropic etch, meaning that a given material is etched substantially in all directions, and may result in significant bloating of the actual gate cut relative to the desired shape. In extreme cases, lateral encroachment of such gate cuts may disable one or more fins.

Described herein are transistor arrangements fabricated by forming a metal gate cut as a trench that is non-selective to the gate sidewalls, in an etch process that can remove both the gate electrode materials and the surrounding dielectrics. Such an etch process may provide improvements in terms of accuracy, cost-efficiency, and device performance, compared to conventional approaches to forming metal gate cuts. In addition, such a process may be used to provide power rails (i.e., electrical interconnects for providing power and/or signals to one or more transistors of a transistor arrangement), if the trench of a metal gate cut is to be at least partially filled with an electrically conductive material. Because the electrically conductive material is in the trench and may be in between the fins, as opposed to being provided over the fins, such power rails are referred to herein as "recessed." Providing recessed power rails may provide improvements in terms of reduced metal line resistance and reduced voltage droop.

As the foregoing illustrates, metal gate cuts as described herein may be used to address the scaling challenges of conventional transistor arrangements and enable high density arrangements compatible with advanced complementary metal-oxide-semiconductor (CMOS) processes. Other technical effects will be evident from various embodiments described here.

While descriptions provided herein refer to FinFETs, these descriptions are equally applicable to embodiments any other non-planar FETs besides FinFETs, e.g., to nanoribbon transistors, nanowire transistors, or transistors such as nanoribbon/nanowire transistors but having transverse cross-sections of any geometry (e.g., oval, or a polygon with rounded corners).

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D region/contact" to indicate that the region/contact can be either a source region/contact, or a drain region/contact. In another example, the term "high-k dielectric" refers to a material having a higher dielectric constant (k) than silicon oxide, while the term "low-k dielectric" refers to a material having a lower k than silicon oxide. If used, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

In the present disclosure, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function. The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 4A-4D, such a collection may be referred to herein without the letters, e.g., as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various transistor arrangements with one or more metal gate cuts and/or recessed power rails as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example FinFET

FIG. 1 is a perspective view of an example FinFET 100, according to some embodiments of the disclosure. The FinFET 100 illustrates one example of transistors that may be implemented in various transistor arrangements described herein, e.g., in the transistor arrangements shown in FIGS. 2-7. The FinFET 100 shown in FIG. 1 is intended to show relative arrangement(s) of some of the components therein. In various embodiments, the FinFET 100, or portions thereof, may include other components that are not illustrated (e.g., any further materials, such as e.g. spacer materials, surrounding the gate stack of the FinFET 100, electrical contacts to the S/D regions of the FinFET 100, etc.).

As shown in FIG. 1, the FinFET 100 may be provided over a base 102, where the term "base" may refer to any suitable support structure on which a transistor may be built, e.g., a substrate, a die, a wafer, or a chip. As also shown in FIG. 1, the FinFET 100 may include a fin 104, extending away from the base 102. A portion of the fin 104 that is closest to the base 102 may be enclosed by an insulator material 106, commonly referred to as a "shallow trench isolation" (STI). The portion of the fin 104 enclosed on its' sides by the STI 106 is typically referred to as a "subfin portion" or simply a "subfin." As further shown in FIG. 1, a gate stack 108 that includes at least a layer of a gate electrode material 112 and, optionally, a layer of a gate dielectric 110, may be provided over the top and sides of the remaining upper portion of the fin 104 (e.g., the portion above and not enclosed by the STI 106), thus wrapping around the upper-most portion of the fin 104. The portion of the fin 104 over which the gate stack 108 wraps around may be referred to as a "channel portion" of the fin 104 because this is where, during operation of the FinFET 100, a conductive channel may form. The channel portion of the fin 104 is a part of an active region of the fin 104. A first S/D region 114-1 and a second S/D region 114-2 (also commonly referred to as "diffusion regions") are provided on the opposite sides of the gate stack 108, forming source and drain terminals of the FinFET 100.

In general, implementations of the present disclosure may be formed or carried out on a support structure such as a semiconductor substrate, composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which transistor arrangements with one or more metal gate cuts and/or recessed power rails as described herein may be built falls within the spirit and scope of the present disclosure. In various embodiments, the base 102 may include any such substrate material that provides a suitable surface for forming the FinFET 100.

As shown in FIG. 1, the fin 104 may extend away from the base 102 and may be substantially perpendicular to the base 102. The fin 104 may include one or more semiconductor materials, e.g. a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions may be formed during operation of a transistor.

As shown in FIG. 1, the STI material 106 may enclose the sides of the fin 104. A portion of the fin 104 enclosed by the STI 106 forms a subfin. In various embodiments, the STI material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1. In particular, the gate dielectric 110 may wrap around the upper-most portion of the fin 104, and the gate electrode 112 may wrap around the gate dielectric 110. The interface between the channel portion of the fin 104 and the subfin portion of the fin 104 is located proximate to where the gate electrode 112 ends.

The gate electrode 112 may include one or more gate electrode materials, where the choice of the gate electrode materials may depend on whether the FinFET 100 is a P-type metal-oxide-semiconductor (PMOS) transistor or an N-type metal-oxide-semiconductor (NMOS) transistor. For a PMOS transistor, gate electrode materials that may be used in different portions of the gate electrode 112 may include, but are not limited to, ruthenium, palladium, platinum, cobalt, nickel, and conductive metal oxides (e.g., ruthenium oxide). For an NMOS transistor, gate electrode materials that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where zero or more materials of the stack are workfunction (WF) materials and at least one material of the stack is a fill metal layer. Further materials/layers may be included next to the gate electrode 112 for other purposes, such as to act as a diffusion barrier layer or/and an adhesion layer.

If used, the gate dielectric 110 may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

In some embodiments, the gate stack 108 may be surrounded by a dielectric spacer, not specifically shown in FIG. 1. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, e.g., the subfin portion of the fin 104, may be surrounded by the STI material 106 which may, e.g., include any of the high-k dielectric materials described herein.

In some embodiments, the fin 104 may be composed of semiconductor material systems including, for example, N-type or P-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as e.g. Si or Ge. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example N-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e., a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter ($cm^{-3}$), and advantageously below $10^{13}$ $cm^{-3}$. The subfin portion of the fin 104 may be a III-V material having a band offset (e.g., conduction band offset for N-type devices) from the channel portion. Example materials include, but are not limited to, GaAs, GaSb, GaAsSb, GaP, InAlAs, GaAsSb, AlAs, AlP, AlSb, and AlGaAs. In some N-type transistor embodiments of the FinFET 100 where the channel portion of the fin 104 is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 104 are each, or include, group IV semiconductors (e.g., Si, Ge, SiGe). The subfin of the fin 104 may be a first elemental semiconductor (e.g., Si or Ge) or a first SiGe alloy (e.g., having a wide bandgap).

For some example P-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. The subfin of the fin 104 may be a group IV material having a band offset (e.g., valance band offset for P-type devices) from the channel portion. Example materials include, but are not limited to, Si or Si-rich SiGe. In some P-type transistor embodiments, the subfin of the fin 104 is Si and at least a portion of the subfin may also be doped with impurities (e.g., N-type) to a higher impurity level than the channel portion.

Turning to the first S/D region 114-1 and the second S/D region 114-2 on respective different sides of the gate stack 108, in some embodiments, the first S/D region 114-1 may be a source region and the second S/D region 114-2 may be a drain region. In other embodiments this designation of source and drain may be interchanged, i.e., the first S/D region 114-1 may be a drain region and the second S/D region 114-2 may be a source region. Although not specifically shown in FIG. 1, the FinFET 100 may further include S/D electrodes (also commonly referred to as "S/D contacts"), formed of one or more electrically conductive materials, for providing electrical connectivity to the S/D regions 114, respectively. In some embodiments, the S/D regions 114 of the FinFET 100 may be regions of doped semiconductors, e.g., regions of doped channel material of the fin 104, so as to supply charge carriers for the transistor channel. In some embodiments, the S/D regions 114 may be highly doped, e.g. with dopant concentrations of about $1.10^{21}$ $cm^{-3}$ in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g., higher than a dopant concentration in a region of the semiconductor channel material between the first S/D region 114-1 and the second S/D region 114-2, and, therefore, may be referred to as "highly doped" (HD) regions.

In some embodiments, the S/D regions 114 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the fin 104 to form the S/D regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the S/D regions 114).

The FinFET 100 may have a gate length, GL, (i.e. a distance between the first S/D region 114-1 and the second S/D region 114-2), a dimension measured along the fin 104 in the direction of the x-axis of the example reference coordinate system x-y-z shown in FIG. 1, which may, in some embodiments, be between about 5 and 40 nanometers, including all values and ranges therein (e.g. between about 22 and 35 nanometers, or between about 15 and 25 nanometers). The fin 104 may have a thickness, a dimension measured in the direction of the y-axis of the reference coordinate system x-y-z shown in FIG. 1, that may, in some embodiments, be between about 4 and 15 nanometers, including all values and ranges therein (e.g. between about 5 and 10 nanometers, or between about 7 and 12 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g. between about 30 and 200 nanometers, between about 75 and 250 nanometers, or between about 150 and 300 nanometers).

Although the fin 104 illustrated in FIG. 1 is shown as having a rectangular cross-section in a z-y plane of the reference coordinate system shown in FIG. 1, the fin 104 may instead have a cross-section that is rounded or sloped at the "top" of the fin 104, and the gate stack 108 (including the different portions of the gate dielectric 110) may conform to this rounded or sloped fin 104. In use, the FinFET 100 may form conducting channels on three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate).

While FIG. 1 illustrates a single FinFET 100, in some embodiments, a plurality of FinFETs may be arranged next to one another (with some spacing in between) along the fin 104.

Example Transistor Arrangements

Figure 2:
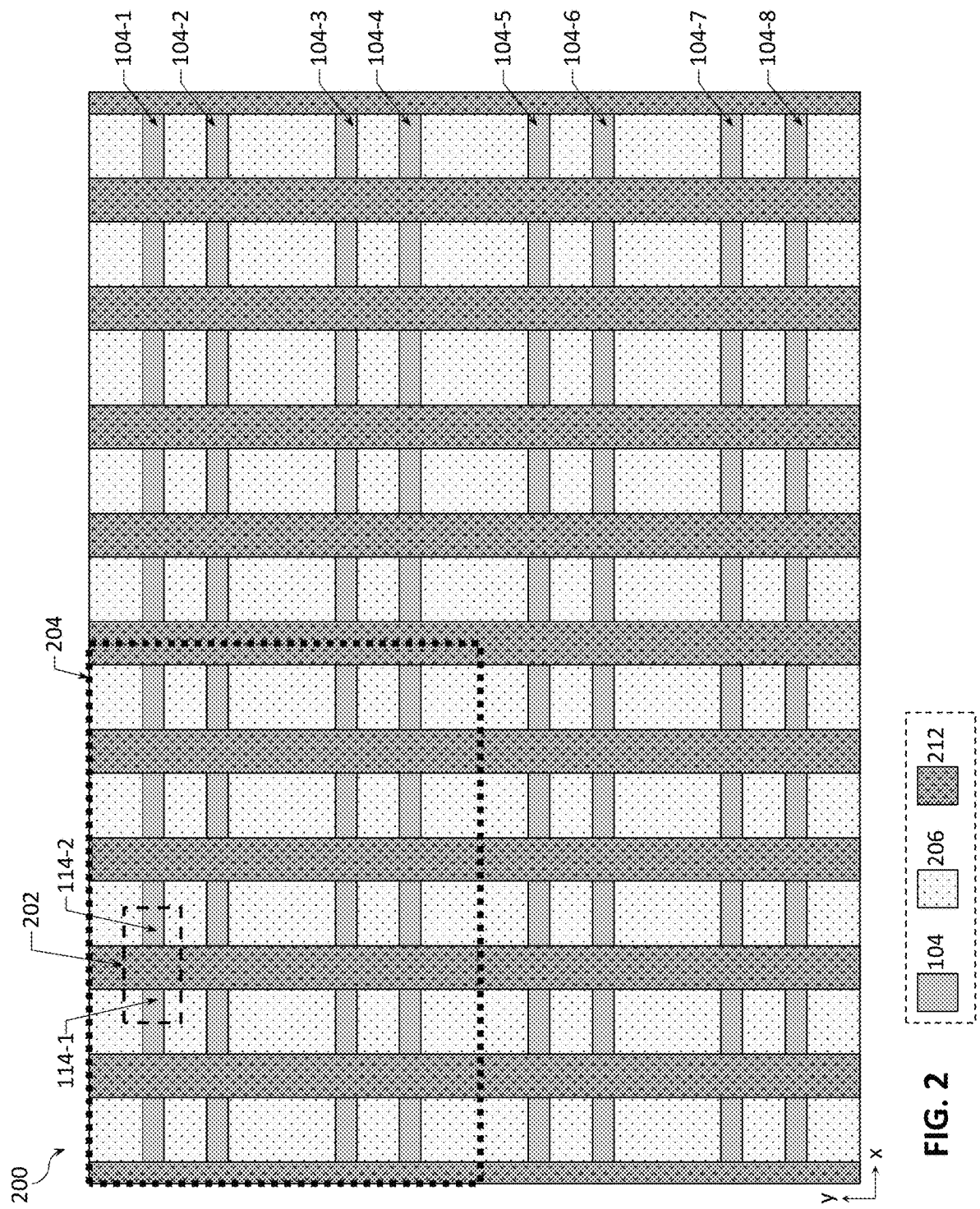
FIG. 2 is a top-down view of an example integrated circuit (IC) device that implements a transistor arrangement in which metal gate cuts and recessed power rails according to various embodiments of the disclosure may be implemented.
Figure 3:
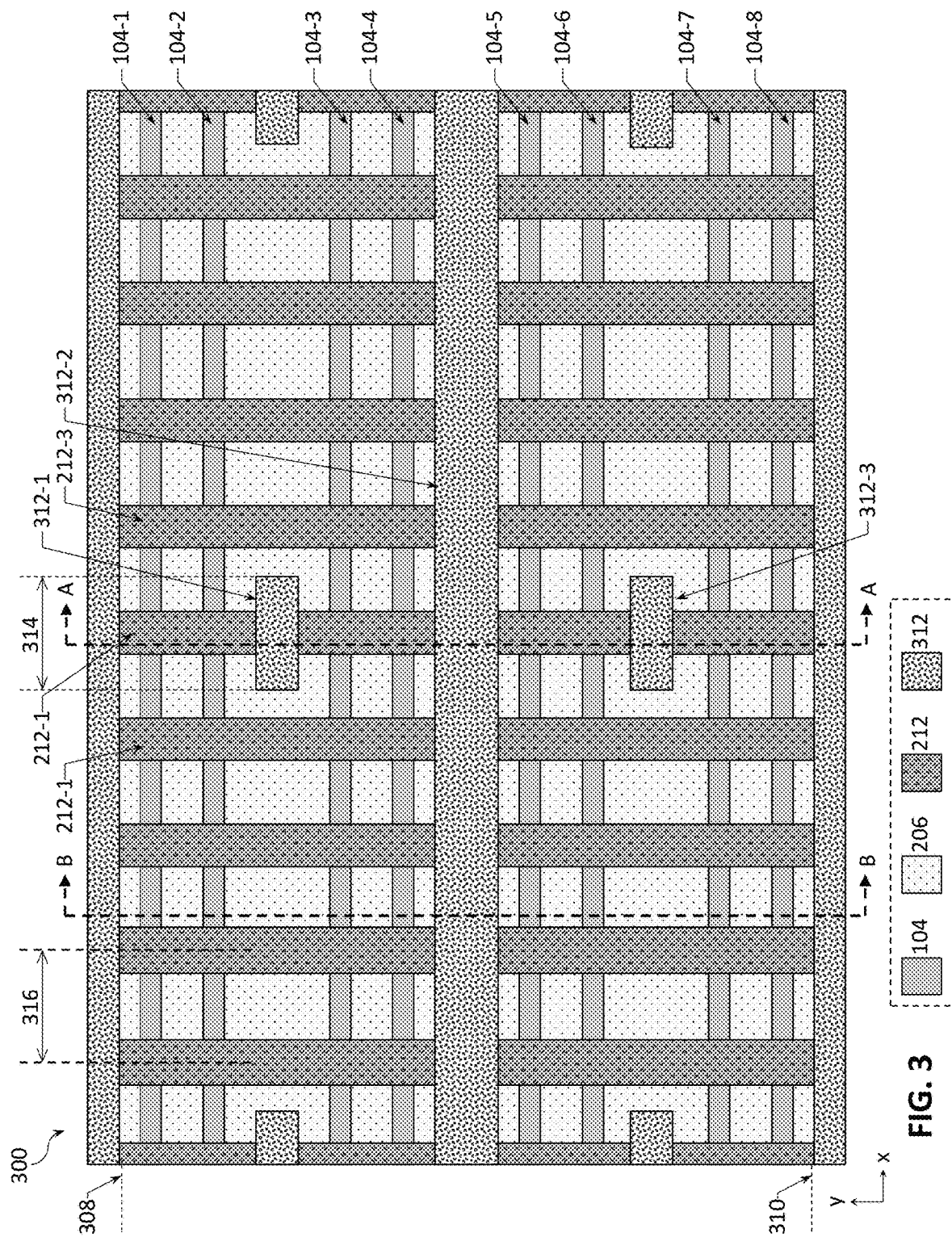
FIG. 3 is a top-down view of the IC device of FIG. 2 with metal gate cuts across some metal gate lines of the transistor arrangement, according to some embodiments of the disclosure.

FIGS. 2 and 3 provide top-down views (i.e., the views of the x-y plane of the example reference coordinate system shown in FIG. 1) of an example IC device that implements a transistor arrangement in which metal gate cuts and recessed power rails according to various embodiments of the disclosure may be implemented. In particular, FIG. 2 illustrates a transistor arrangement 200 without any metal gate cuts, while FIG. 3 illustrates a transistor arrangement 300 with metal gate cuts across some metal gate lines, according to some embodiments of the disclosure. The transistor arrangements shown in FIGS. 2 and 3 are intended to show relative arrangement(s) of some of the components therein and in various embodiments, the transistor arrangements shown in FIGS. 2 and 3, or portions thereof, may include other components that are not illustrated (e.g., any further materials, such as spacer materials, STI, S/D regions or electrical contacts thereto, etc.). Same holds for subsequent drawings of the present disclosure.

A legend provided within a dashed box at the bottom of FIGS. 2 and 3 illustrates colors/patterns used to indicate some portions or materials of some of the elements shown in FIG. 2, so that FIGS. 2 and 3 are not cluttered by too many reference numerals (the same holds for subsequent drawings of the present disclosure that include a legend at the bottom of the drawings). For example, FIGS. 2 and 3 use different colors/patterns to identify the fins 104, dielectric spacers 206, and metal gate lines 212.

The transistor arrangements shown in FIGS. 2 and 3, and in some of the subsequent drawings, are examples of how a plurality of the FinFETs 100 may be arranged in an IC device. Therefore, the transistor arrangements shown in FIGS. 2-3 and in some of the subsequent drawings illustrate some elements labeled with the same reference numerals as those used in FIG. 1 to indicate similar or analogous elements in these drawings, so that, in the interests of brevity, descriptions of a given element provided with reference to one drawing does not have to be repeated again for other drawings. For example, FIGS. 2 and 3 illustrate the fin 104 (in particular, a plurality of such fins), and example S/D regions 114 for one example FinFET of the transistor arrangements of FIGS. 2 and 3. The same holds for subsequent drawings of the present disclosure—elements with reference numerals used in one drawing and shown again in another drawing refer to similar or analogous elements so that their descriptions do not have to be repeated for each drawing.

As shown in FIG. 2, the transistor arrangement 200 may include a plurality of fins 104, which, in some embodiments, may extend substantially parallel to one another. Different instances of the fins 104 are shown in FIG. 2 with a dash and a different reference numeral after the reference numeral for the fin, 104 (the same notation is used for other elements in other drawings). The transistor arrangement 200 illustrates an example of 8 fins 104, labeled as fins 104-1 through 104-8, but, in other embodiments, any other number of two or more fins 104 may be implemented in the transistor arrangement 200.

Once the fins 104 are fabricated, metal gate lines 212 may be provided over the fins 104, crossing multiple fins 104. In some embodiments, the metal gate lines 212 may extend substantially perpendicular to the length of the fins 104. For example, if the fins 104 extend in the direction of the x-axis of the example coordinate system used in the present drawings (as shown in FIG. 1), then the metal gate lines 212 may extend in the direction of the y-axis, as is shown in FIG. 2. In some embodiments, the metal gate lines 212 may be shaped as ridges, substantially perpendicular to the length of the fins 104 and enclosing different portions of the fins 104. At least portions of the metal gate lines 212 provided over the fins 104, i.e., where gates of FinFETs may be formed, as described with reference to FIG. 1, may include the gate electrode material 112, thus forming gate stacks 108, described above. In some embodiments, all of the metal gate lines 212 (i.e., also between the fins 104) are formed of one or more of the gate electrode material 112. In some embodiments, the gate electrode material 112 used in one portion of a given metal gate line 212 may have a material composition that is different from the material composition of the gate electrode material 112 used in another portion of that particular metal gate line 212. For example, the material composition of a portion of a given metal gate line 212 crossing the fins 104 in which NMOS transistors are to be formed may be different from the material composition of a portion of that metal gate line 212 crossing the fins 104 in which PMOS transistors are to be formed. For example, the fins 104-1 and 104-2 may be fins in which NMOS transistors can be formed, while the fins 104-3 and 104-4 may be fins in which PMOS transistors can be formed.

A dashed contour shown in FIG. 2 illustrates an example of a FinFET 202 formed in one of the fins 104, namely, in the fin 104-1. The FinFET 202 may be an example of the FinFET 100, described above. FIG. 2 illustrates the S/D regions 114 for the FinFET 202, and a portion of the metal gate line 212 crossing the fin 104-1 forms the gate stack 108 of the FinFET 202. A plurality of other such FinFETs are shown in FIG. 2, although they are not specifically labeled with reference numerals in order to not clutter the drawings.

In some embodiments, a plurality of FinFETs 202 may be arranged to form a cell with a particular logic function, e.g., a cell 204, shown in FIG. 2 to be within a dotted contour. The cell 204 illustrates an example IC cell (i.e., a unit an IC device) that may implement a certain functionality, which cell may then be provided multiple times in an array form. The transistor arrangement 200 illustrates 4 such cells. Of course, in other embodiments of the transistor arrangement 200, the cells may be different from the cell 204 and/or the FinFETs 202 may be arranged in ways that do not include repeating cell units.

FIG. 2 further illustrates that portions of the transistor arrangement 200 surrounding the upper portions of the fins 104 may be enclosed by a dielectric material 206, which may include one or more of the dielectric spacer materials, described above. Although the top-down view of FIG. 2 illustrates the tops of the fins 104 in the portions where the metal gate lines 212 are not crossing the fins, in some embodiments, the dielectric material 206 may cover the tops of the fins 104 in those portions (in which case the fins 104 would not be visible in the top-down view of the transistor arrangement 200).

As described above, a given design may require that some of the metal gate lines 212 are cut to disrupt the electrical continuity between different portions of the transistor arrangement 200 and decouple the gates of different FinFETs 202. FIG. 3 is a top-down view of the IC device of FIG. 2 with metal gate cuts 312 provided in some of the metal gate lines 212 of the transistor arrangement 200, according to some embodiments of the disclosure. The transistor arrangement 300 is different from the transistor arrangement 200 in that it includes the metal gate cuts 312 in some example locations of the transistor arrangement 200. Although a certain number of the metal gate cuts 312 is shown in the transistor arrangement 300, this is only for the purpose of illustrating various features of different metal gate cuts according to embodiments of the present disclosure, and in other embodiments of the transistor arrangement 300, any other number of the metal gate cuts 312, implemented in other locations than those shown in FIG. 3, may be implemented.

In various embodiments, some of the metal gate cuts 312 may cross only a single metal gate line 212, as is shown in FIG. 3 with the metal gate cuts 312-1 and 312-3 (some other examples of such metal gate cuts are also shown in FIG. 3 but not specifically labeled in order to not clutter the drawing), while other metal gate cuts 312 may cross multiple metal gate lines 212, as is shown in FIG. 3 with the metal gate cut 312-2 (some other examples of such a metal gate cut are also shown in FIG. 3 but not specifically labeled in order to not clutter the drawing). In some embodiments, the metal gate cuts 312 provided across only a single metal gate line 212 may extend to about the mid-point between that metal gate line 212 and the next adjacent metal gate line 212, which may be in both directions of the length of the metal gate cut 312 (the length of a metal gate cut being a dimension measured along the x-axis of the example coordinate system used in the present drawings). This is illustrated in FIG. 3 for the metal gate cut 312-1, provided in the metal gate line 212-2, between the metal gate line 212-1 and the metal gate line 212-3. As shown in FIG. 3, the length 314 of the metal gate cut 312-1 maybe greater than the width of the metal gate line 212-2 that it cuts (the width of a metal gate line being a dimension measured along the x-axis of the example coordinate system used in the present drawings). In other words, the edge of the metal gate cut 312 in the plane that is perpendicular to the longitudinal axis of the fins 104 (the longitudinal axis of the fins 104 being lines parallel the x-axis of the example coordinate system used in the present drawings) may extend beyond the sidewall of the metal gate line 212 that it cuts by about 30% (e.g., at least about 40% or at least about 50%) of the distance between that metal gate line 212 and the closest next adjacent metal gate line 212 that is not cut. Thus, in some embodiments, the length 314 may be substantially equal to the gate-to-gate pitch (e.g., measured as the distance between the centers of two closest adjacent metal gate lines 212, shown in FIG. 3 as a distance 316).

In various embodiments, the metal gate cuts 312 may be, substantially, openings formed in the gate electrode material 112 of the metal gate lines 212, which openings may subsequently be filled with one or more dielectric materials and, optionally, one or more electrically conductive materials, as will be described in greater detail below. The one or more dielectric materials may, in general, include any of the dielectric materials described above, e.g., any of the dielectric spacer materials described above. However, it is likely that the exact material composition of the one or more dielectric materials filling the openings of the metal gate cuts 312 may be different from the material composition of the one or more dielectric materials of the dielectric spacer 206. In this case, the metal gate cuts 312 may be clearly distinguishable in images of various characterization equipment, such as in cross-sectional or planar TEM, or with cross-sectional SEM.

In order to further illustrate the details of the example metal gate cuts 312 of the transistor arrangement 300, cross-sectional side views along planes A-A and B-B (indicated in FIG. 3) are shown in FIGS. 4 and 5, respectively. Furthermore, each of FIGS. 4 and 5 include a plurality of drawings, shown as FIGS. 4A-4C and FIGS. 5A-5E, respectively, illustrating different embodiments/features of the cross-sectional side views along the planes A-A and B-B. In particular, each of FIGS. 4A-4C provides a cross-sectional side view of a portion 400 of the transistor arrangement 300 of FIG. 3 with a cross-section taken along one of the metal gate lines 212, along the plane A-A shown in FIG. 3, according to some embodiments of the disclosure. Each of FIGS. 5A-5E provides a cross-sectional side view of a portion 500 of the transistor arrangement 300 of FIG. 3 with a cross-section taken along one of the S/D regions 114, along the plane B-B shown in FIG. 3, according to some embodiments of the disclosure. FIGS. 4A-4C and FIGS. 5A-5E provide the views of the y-z plane of the example reference coordinate system shown in FIG. 1, where each of the portions of the transistor arrangement 300 shown in FIGS. 4A-4C and FIGS. 5A-5E are portions between lines 308 and 310, illustrated in FIG. 3.

Figure 4A:
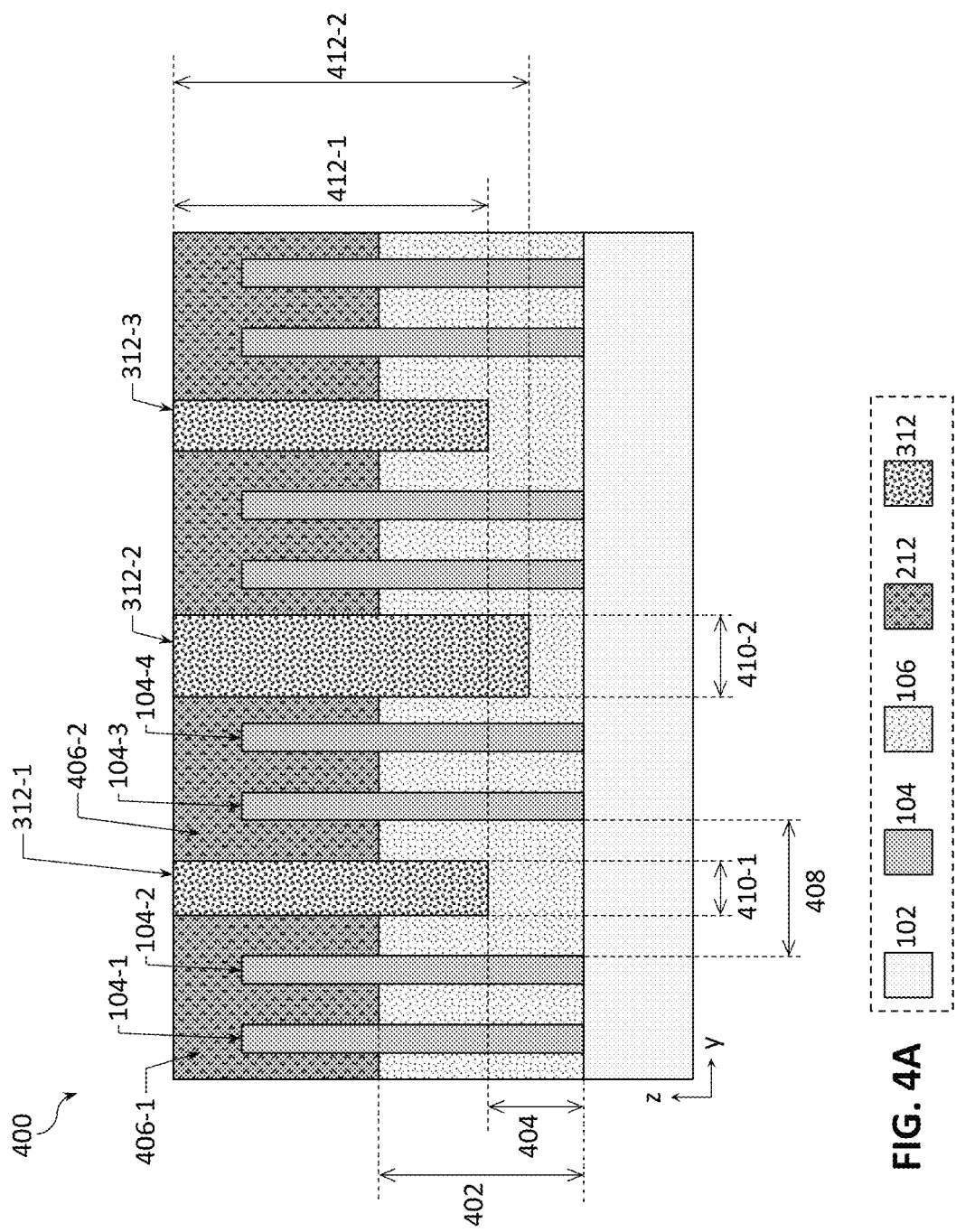
FIG. 4A provides a cross-sectional side view of the transistor arrangement of FIG. 3 with a cross-section taken along an example metal gate line, according to one embodiment of the disclosure.

In some embodiments, because of the non-selective nature of the etch used to form the metal gate cuts 312, described in greater detail below, the metal gate cuts 312 may, characteristically, not be aligned with the bottom of the metal gate lines 212. This is shown in FIG. 4A with the bottom of the metal gate line 212 being farther away from the base 102 than the bottoms of all of the metal gate cuts 312 shown in FIG. 4A. For example, in some embodiments, a distance 402 from the base 102 to the metal gate line 212 may be at least about 3 nanometers larger, e.g., at least about 5 nanometers larger or at least about 10 nanometers larger, than a distance 404 from the base 102 to the bottom of the metal gate cut 312-1. In other words, the opening of the metal gate cut 312-1 may extend further towards the base 102 than the gate electrode material 112 of the metal gate line 212, e.g., at least about 5 nanometers further. In other words, the metal gate cuts 312 may extend through the gate electrode material 112 of the metal gate line 212 and into the STI 106, as is shown in FIG. 4A.

FIG. 4A also illustrates how the metal gate cuts 312 provide discontinuity in the gate electrode materials 112 over different fins 104. For example, the metal gate cut 312-1 is an opening in the gate electrode material 112 of the metal gate line 212, the opening separating the gate electrode material 112 into a first portion, shown in FIG. 4A as a portion 406-1, that wraps around the fin 104-2, and a second portion, shown in FIG. 4A as a portion 406-2, that wraps around the fin 104-3. When the metal gate cut 312-1 is at least partially filled with one or more dielectric materials, such an opening disrupts electrical continuity between the portion 406-1 and the portion 406-2 of the gate electrode material 112, thus decoupling the gates of the respective FinFETs formed in the fin 104-2 and the fin 104-3.

In some embodiments, the distance between the fins 104, e.g., a distance 408 between the fin 104-2 and the fin 104-3, shown in FIG. 4A, may be between about 10 and 200 nanometers, including all values and ranges therein, e.g., between about 20 and 75 nanometers, or between about 30 and 50 nanometers, e.g., around about 38 nanometers. In some embodiments, the width of the metal gate cuts 312 (a dimension measured along the y-axis of the example coordinate system used in the present drawings) may be based on the distance between the fins 104 because the metal gate cuts 312 are to be provided between the fins 104. In some embodiments, the aspect ratio of the metal gate cuts 312, i.e., a ratio of the depth of an opening formed to create the metal gate cut 312 (a dimension measured along the z-axis of the example coordinate system used in the present drawings) to the width of the opening, may also depend on the distance between the fins 104. In some embodiments, the aspect ratio of the metal gate cuts 312 may be between about 2 and 30, including all values and ranges therein, e.g., between about 2 and 20, or between about 5 and 15, e.g., around about 10.

In some embodiments, the metal gate cuts 312 that extend over multiple metal gate lines 212 may be wider and deeper than the metal gate cuts 312 that extend over smaller number of metal gate lines, e.g., over only one metal gate line. This is shown in FIG. 4A with the metal gate cut 312-2 being both wider (where, again, the width is measured along the y-axis of the example coordinate system used in the present drawings) and deeper (where, again, the depth is measured along the z-axis of the example coordinate system used in the present drawings) than the metal gate cuts 312-1 and 312-3. For example, as shown in FIG. 4A, in some embodiments, a width 410-1 of the metal gate cut 312-1 may be smaller than a width 410-2 of the metal gate cut 312-2, e.g., at least 5% smaller, including all values and ranges therein, e.g., at least 10% smaller or at least 30% smaller. Furthermore, as also shown in FIG. 4A, in some embodiments, a depth 412-1 of the metal gate cut 312-1 may be smaller than a depth 412-2 of the metal gate cut 312-2, e.g., at least 5% smaller, including all values and ranges therein, e.g., at least 10% smaller or at least 30% smaller.

In some implementations, the fact that, in a given transistor arrangement, the metal gate cuts 312 that are wider than other metal gate cuts 312 are also deeper may be characteristic of the fabrication method used to form the openings for these metal gate cuts in accordance with embodiments of the present disclosure, described below. For example, this may be indicative of the ion bombardment used to form the openings—if an opening is wider (as, e.g., defined by a mask used to create the opening), then more ions may get in, resulting in a deeper etch, compared to openings of smaller dimensions.

Figure 4B:
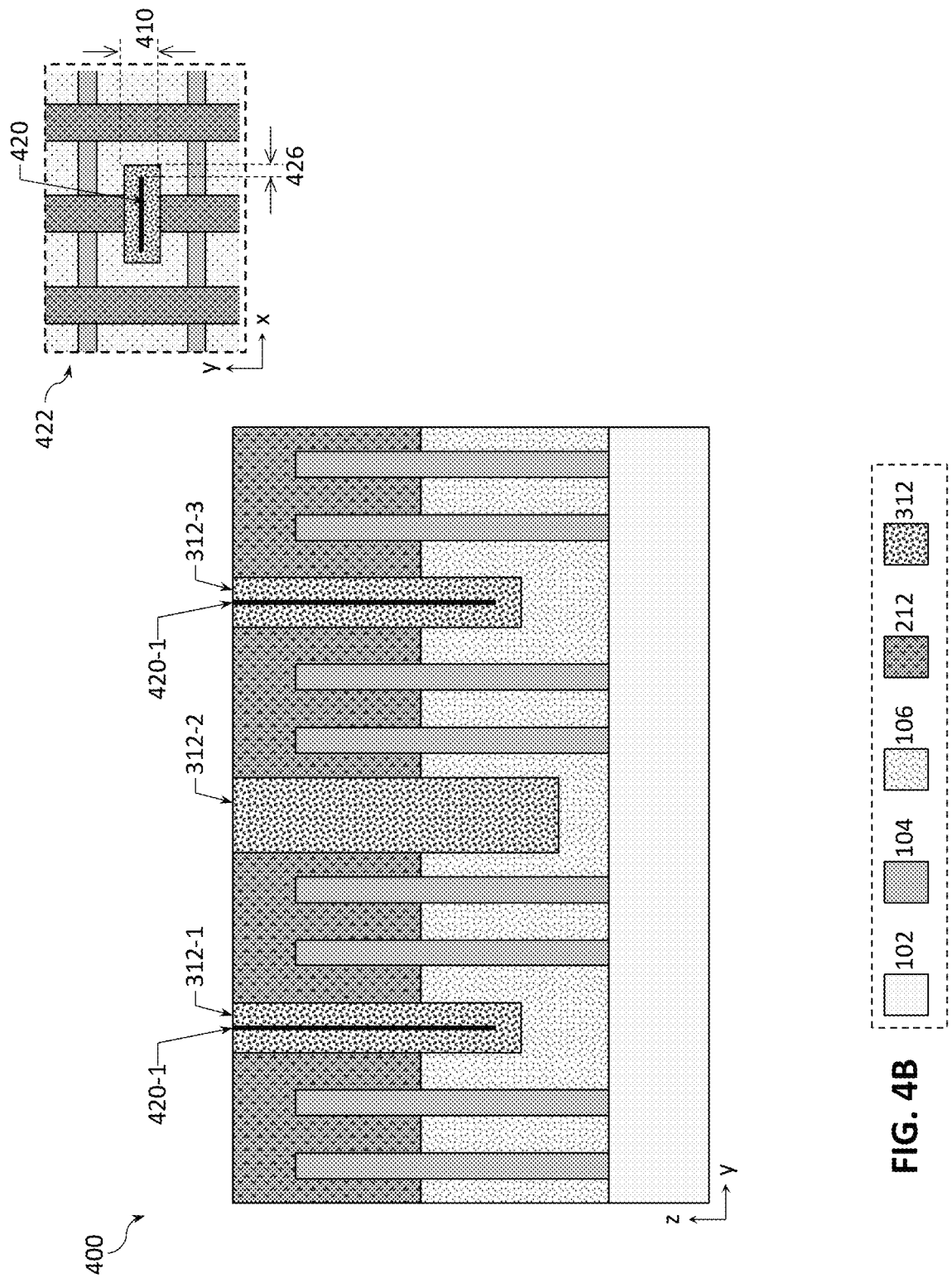
FIG. 4B provides a cross-sectional side view of the transistor arrangement of FIG. 3 with a cross-section taken along an example metal gate line, according to another embodiment of the disclosure.

The openings for the metal gate cuts which are relatively narrow and have a relatively high aspect ratio may be difficult to fill uniformly with the dielectric materials. Therefore, in some embodiments, at least some of the metal gate cuts 312 may exhibit a characteristic seam substantially in the middle of the opening used to form the metal gate cut. Example seams in the cross-sectional view are shown in FIG. 4B as seams 420-1 and 420-3 for the metal gate cuts 312-1 and 312-3, respectively. An inset 422 provided in FIG. 4B shows the seam 420 (which may, e.g., be the seam 420-1 or the seam 420-3) in a portion of the top-down view of the transistor arrangement 300. As can be seen from the inset 422 of FIG. 4B, in some embodiments, the seams 420 may extend in planes substantially parallel to the longitudinal axis of the fins 104. Furthermore, as can also be seen from the inset 422 of FIG. 4B, in some embodiments, the seam 420 may be located about at the midway point of the width of the metal gate cut 312 (e.g., of the width 410-1, described above). In some embodiments, the distance from the end of the metal gate cut 312 to the edge of the seam 420, shown in the inset 422 as a distance 426, at two edges of the seam 420, may be approximately the same midway distance (e.g., the distance 426 may be close to half of the width 410). This may be characteristic of using atomic layer deposition (ALD) deposition to fill the opening for the metal gate cut 312 with one or more dielectric materials.

Figure 4C:
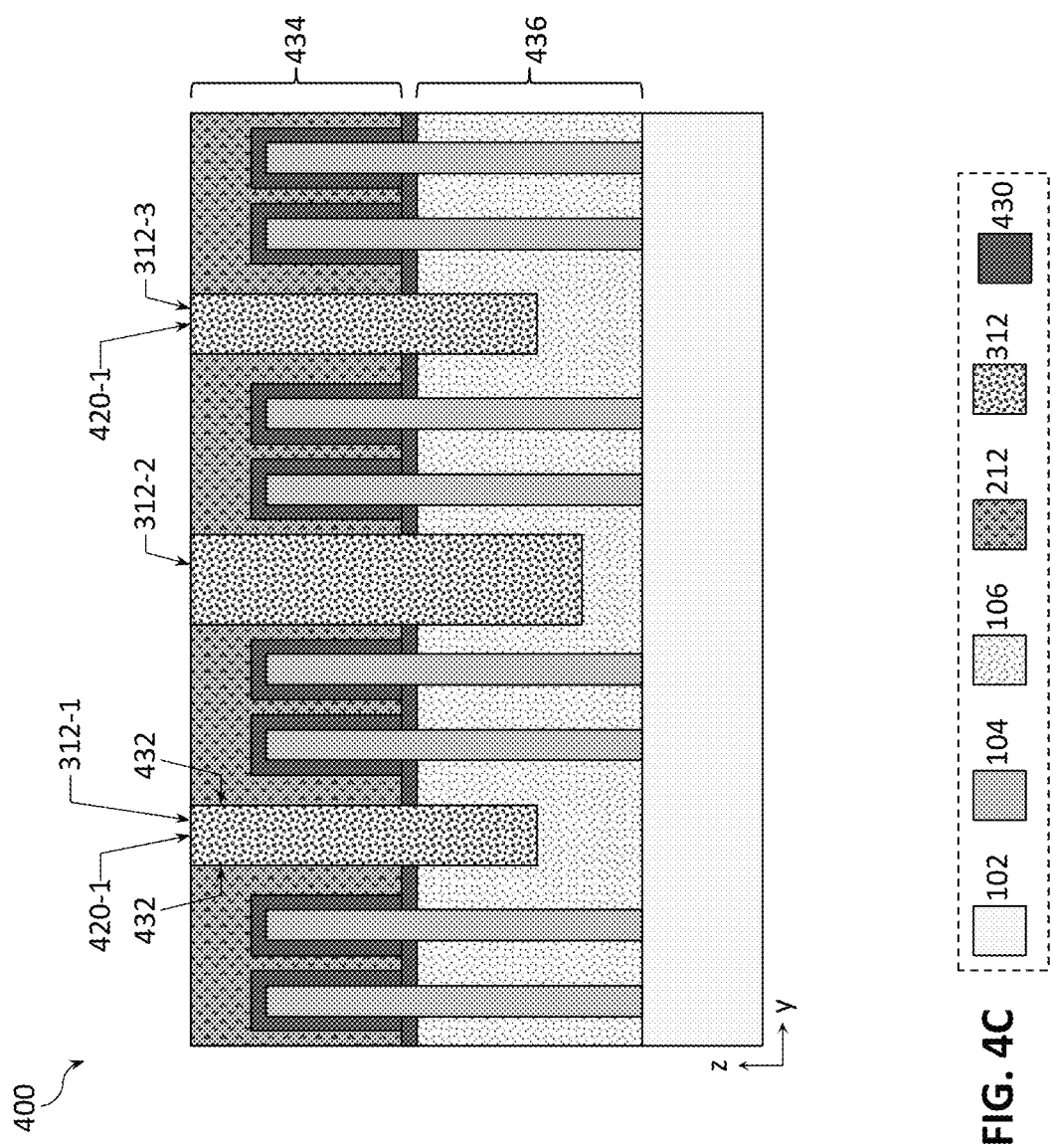
FIG. 4C provides a cross-sectional side view of the transistor arrangement of FIG. 3 with a cross-section taken along an example metal gate line, according to yet another embodiment of the disclosure.
Figure 4D:
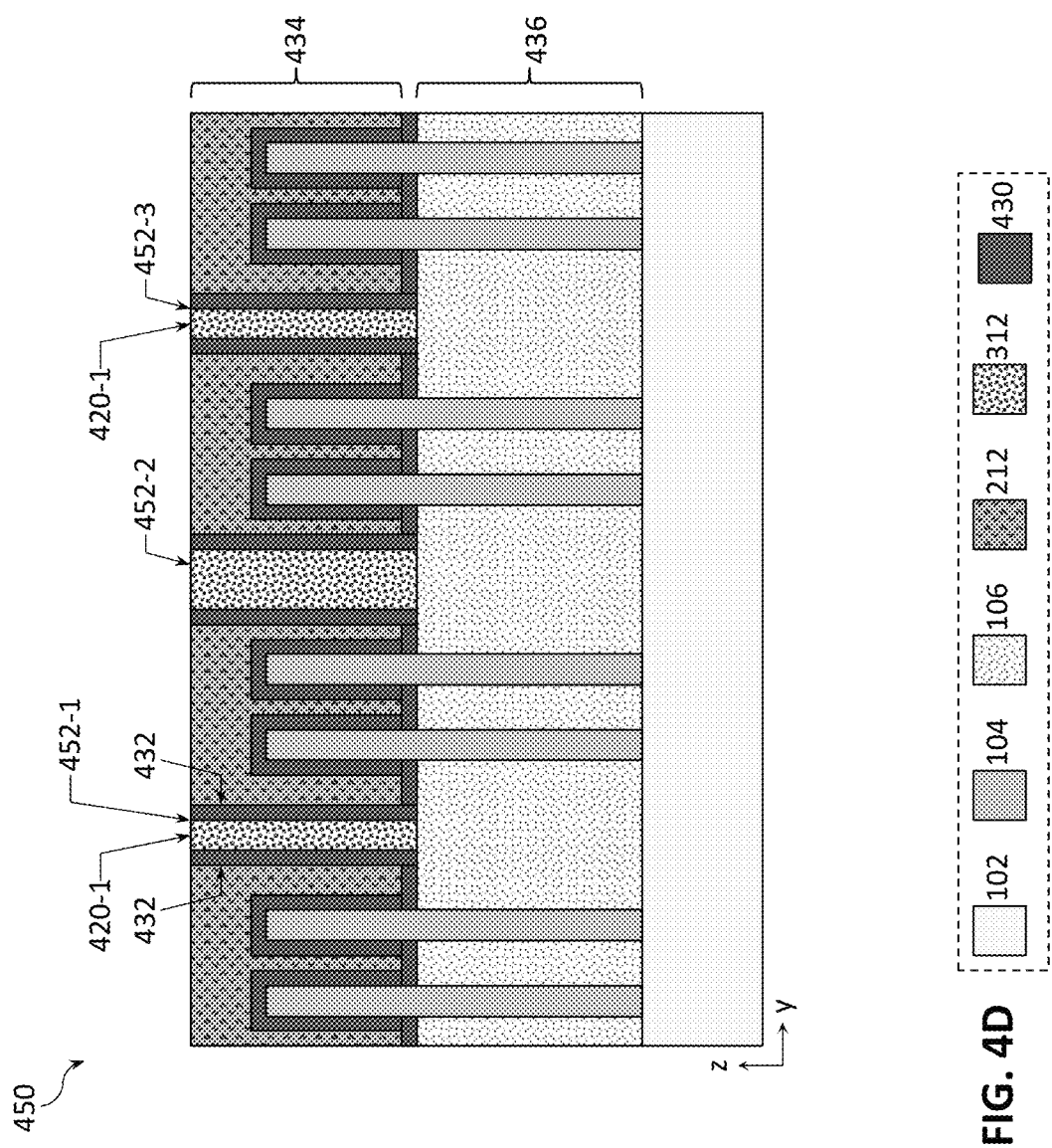
FIG. 4D provides a cross-sectional side view of a transistor arrangement with a polygate cut.

Other characteristic features of metal gate cuts 312 filled with one or more dielectric material may be illustrated with reference to FIG. 4C and FIG. 4D. FIG. 4C provides an illustration of a metal gate cut in a cross-sectional side view of the transistor arrangement of FIG. 3 with a cross-section taken along an example metal gate line, according to some embodiments of the disclosure. FIG. 4D provides an illustration of a conventional polygate cut in a cross-sectional side view of a transistor arrangement analogous to that shown in FIG. 3 with a cross-section taken along an example metal gate line. Similar to FIGS. 4A and 4B, FIG. 4C illustrates the portion 400 of the transistor arrangement 300 of FIG. 3 with a cross-section taken along one of the metal gate lines 212, along the plane A-A shown in FIG. 3. In particular, FIG. 4C specifically illustrates a material 430 which may include the gate dielectric 110 as described above, and may further, optionally, include one or more capping metals, such as titanium nitride or tantalum nitride, which may be present in the portion 400. Although not specifically shown in FIG. 4B, such a material may also be present there, in the same locations as shown in FIG. 4C. FIG. 4C illustrates that, in some embodiments, the one or more dielectric materials filling the metal gate cuts may be in contact with (or abut) the gate electrode material 112 of the metal gate line 212, for the portions of the metal gate cuts which are in the metal gate lines 212, and, for the portions of the metal gate cuts which extend into the STI 106, be in contact with (or abut) the STI 106. Sidewalls labeled as 432 for one example metal gate cut shown in FIG. 4C (but applicable to all), namely, the metal gate cut 312-1, illustrate how the one or more gate dielectric materials at least partially filling the metal gate cut 312-1, e.g., by at least lining the sidewalls 432, may be in contact with the gate electrode material 112 (e.g., any of the workfunction materials described above) of the metal gate line 212 in a portion 434 (i.e., a portion above the STI 106). Simultaneously, because the metal gate cuts 312 extend into the STI 106, the one or more gate dielectric materials at least partially filling the metal gate cut 312-1 may be in contact with the STI 106 in a portion 436 (i.e., a portion where the STI 106 is). This is another feature characteristic of the opening for the metal gate cuts 312 being formed by a non-selective etch process after the gate stacks of the metal gate lines 212 have been formed. In contrast, FIG. 4D illustrates a portion 450 of a transistor arrangement similar to that shown in FIG. 4C, but fabricated as a result of applying a conventional polygate cut process where polygate cuts 452 (shown as 3 cuts, similar to the cuts 312 shown in FIG. 4C) are formed in a polygate material which is provided as a part of forming the gate stacks. In such a process, the cuts 452 are formed first, and after that the high-k dielectric material 110 and, optionally, one or more capping materials are deposited around the fins, as shown in FIG. 4D with the material 430. After that, the gate electrode material 112 is deposited around the fins, to finish formation of the gate stacks. As a result of this process, the material 430 will be lining the sidewalls 432 of the polygate cuts 452, as shown in FIG. 4D, so the one or more dielectric materials filling the remaining portion of the polygate cuts 452 would not be in contact with the gate electrode material 112. Furthermore, because of the selective etch process used to form conventional polygate cuts 452 (i.e., an etch process where only the polygate material is etched selectively, and the STI 106 is not etched), the polygate cuts 452 would not extend into the STI 106, in contrast to the metal gate cuts 312 shown in FIG. 4C. Comparison of FIGS. 4C and 4D also reveals another advantage of metal gate cuts as described herein over conventional polygate cuts as shown in FIG. 4D, namely, that for a given amount of the gate electrode material 112 provided laterally from the fins, the critical dimensions of the metal gate cuts as described herein can afford to be bigger because the sidewalls of the metal gate cuts are not going to be covered with the material 430 as in FIG. 4D.

As described above, in some embodiments, all of the metal gate cuts 312 formed in a transistor arrangement may be filled, at least partially (e.g., the sidewalls and bottoms of the openings of the metal gate cuts 312 may be lined), with one or more dielectric materials. In other embodiments, optionally, for some of the metal gate cuts 312, once the openings for these metal gate cuts have been lined with one or more dielectric materials, at least a portion of the remaining space of the openings may be filled with one or more electrically conductive materials, which may serve as a recessed power rail for providing signals and power to various portions of the transistor arrangement 300. In this manner, recessed power rails may be formed substantially in the same process as that used to form the metal gate cuts 312 (or an extension of that process). In other words, a metal gate cut formed as a trench, non-selective to the gate sidewalls, as described herein, may be used as a trench in which a recessed power rail can be self-aligned to via material selectivity, placing the recessed power rail within the metal gate cut. An example of a recessed power rail is illustrated in FIG. 5A as a power rail 502, provided in the opening for the metal gate cut 312-2.

Figure 5A:
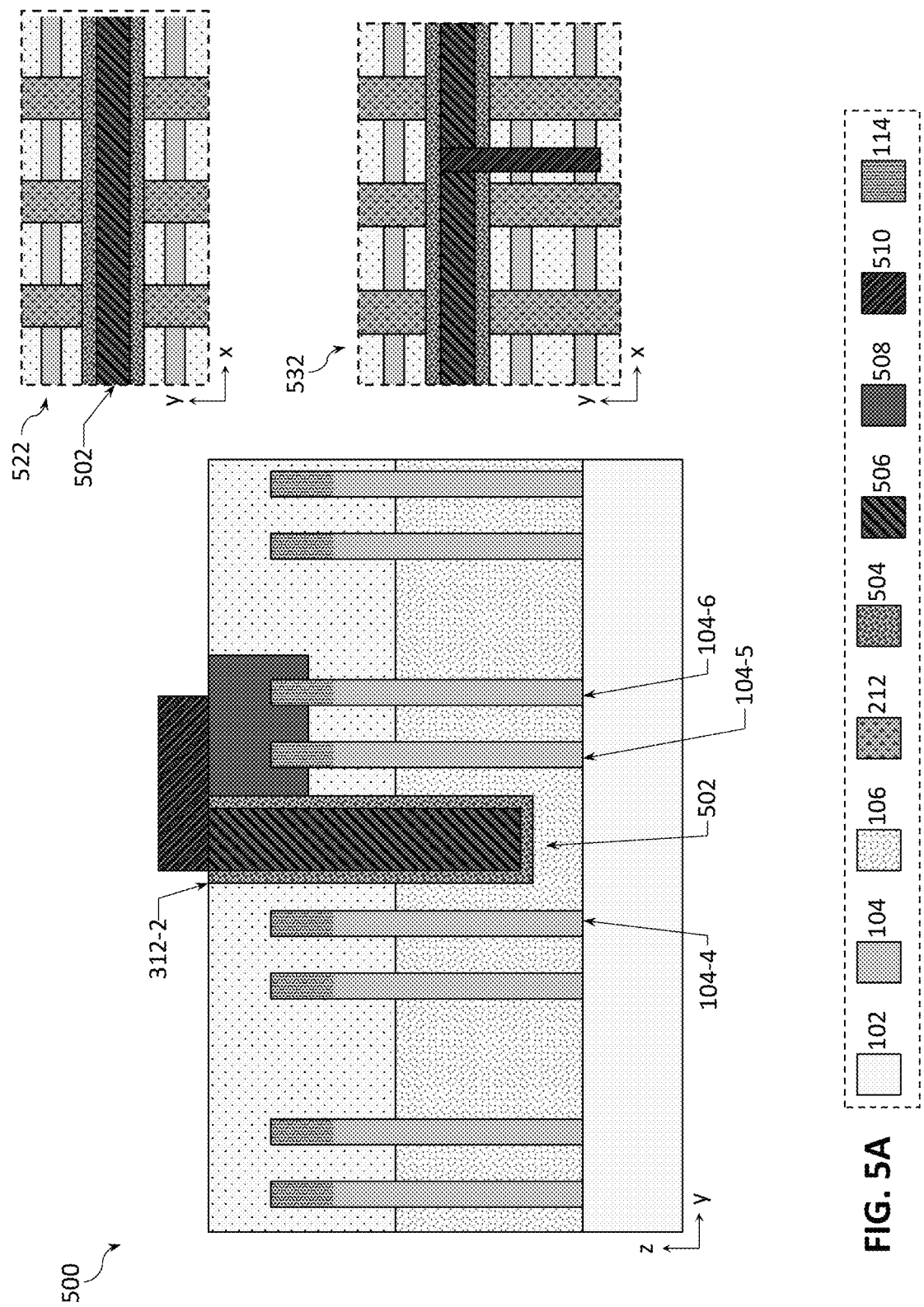
FIGS. 5A-5E provide cross-sectional side views of the transistor arrangement of FIG. 3 with a cross-section taken along source/drain (S/D) regions, according to various embodiments of the disclosure.

As shown in FIG. 5A, the power rail 502 may be formed by providing one or more dielectric materials 504 that line the bottom and the sidewalls of the opening for the metal gate cut 312-2. At least a portion of the remainder of the space of the opening may then be filled with one or more electrically conductive materials 506. In some embodiments, the electrically conductive materials 506 may include any suitable electrically conductive material, alloy, or a stack of multiple electrically conductive materials. In some embodiments, various electrically conductive materials 506 may include one or more metals or metal alloys with metals such as copper, ruthenium, palladium, platinum, cobalt, nickel, hafnium, zirconium, titanium, tantalum, molybdenum, and aluminum. In some embodiments, the electrically conductive materials 506 may include one or more electrically conductive alloys, oxides (e.g., conductive metal oxides), carbides (e.g., hafnium carbide, zirconium carbide, titanium carbide, tantalum carbide, and aluminum carbide), or nitrides (e.g. hafnium nitride, zirconium nitride, titanium nitride, tantalum nitride, and aluminum nitride) of one or more metals.

In some embodiments, the aspect ratio of the metal gate cut 312 which will be used to form the recessed power rail 502, e.g., of the metal gate cut 312-2, may be between about 2 and 15, including all values and ranges therein, e.g., between about 2 and 10, or between about 3 and 8. In some embodiments, the aspect ratio of the metal gate cut 312-2 may be equal or smaller than the aspect ratio of the metal gate cut 312-1. However, in other embodiments, this does not have to be the case and the aspect ratio of the metal gate cut 312-2 may be greater than the aspect ratio of the metal gate cut 312-1. Typically, the opening for the metal gate cut to form the power rail 502 will extend further towards the base 102 than the opening for other metal gate cuts 312, e.g., than the opening for the metal gate cut 312-1, e.g., at least about 5 nanometers further, including all values and ranges therein, e.g., at least about 10 nanometers further or at least about 20 nanometers further.

In some embodiments, the power rail 502 may extend, in a direction of a longitudinal axis of the fins 104, across multiple gate pitches. An example of that is shown in FIG. 3 with the metal gate cut 312-2 extending across the entire transistor arrangement 300, although in other embodiments, the metal gate cut 312-2 in which the power rail 502 is formed may be shorter in length than what is shown in FIG. 3. Also, FIG. 3 does not specifically show the electrically conductive material 506 and the dielectric liner 504 of the power rail 502 provided in the metal gate cut 312-2. An example of a portion of the transistor arrangement 300 showing the details of the power rail 502 provided in the metal gate cut 312-2 is shown in the top-down view of an inset 522 of FIG. 5A. Thus, in some embodiments, the opening for the metal gate cut 312-2 in which the power rail 502 is formed may extend over a plurality of the metal gate lines 212.

The power rail 502 may be electrically decoupled from various other electrically conductive materials of the transistor arrangement, e.g., from the gate electrode materials of the metal gate lines 212, by having the dielectric liner 504. The power rail 502 may then be used to provide power and/or signals to various portions of the transistor arrangements 300, e.g., to one or more transistor terminals (e.g., to any of the S/D terminals 114), by providing electrical coupling to such portions. An example of that is shown in FIG. 5A, illustrating that the electrically conductive material 506 of the power rail may be coupled to a S/D contact 508 by providing an interconnect 510. Each of the S/D contacts 508 and the interconnect 510 may be made of one or more electrically conductive materials, such as those described above (e.g., with reference to the electrically conductive material 506). However, electrical connections between the power rail 502 and various components of the transistor arrangement in which the power rail is implemented may be realized in many other ways, all of which being within the scope of the present disclosure.

The view of FIG. 5A illustrates S/D regions 114 in the plurality of fins 104. The S/D contact 508 may provide electrical coupling to one or more of the S/D regions 114, e.g., to the S/D regions 114 of the fins 104-5 and 104-6, as shown in FIG. 5A. An example of a portion of the transistor arrangement 300 showing the details of the power rail 502 coupled to the S/D regions 114 of the fins 104-5 and 104-6 via the interconnect 510 is shown in the top-down view of an inset 532 of FIG. 5A.

Figure 5B:
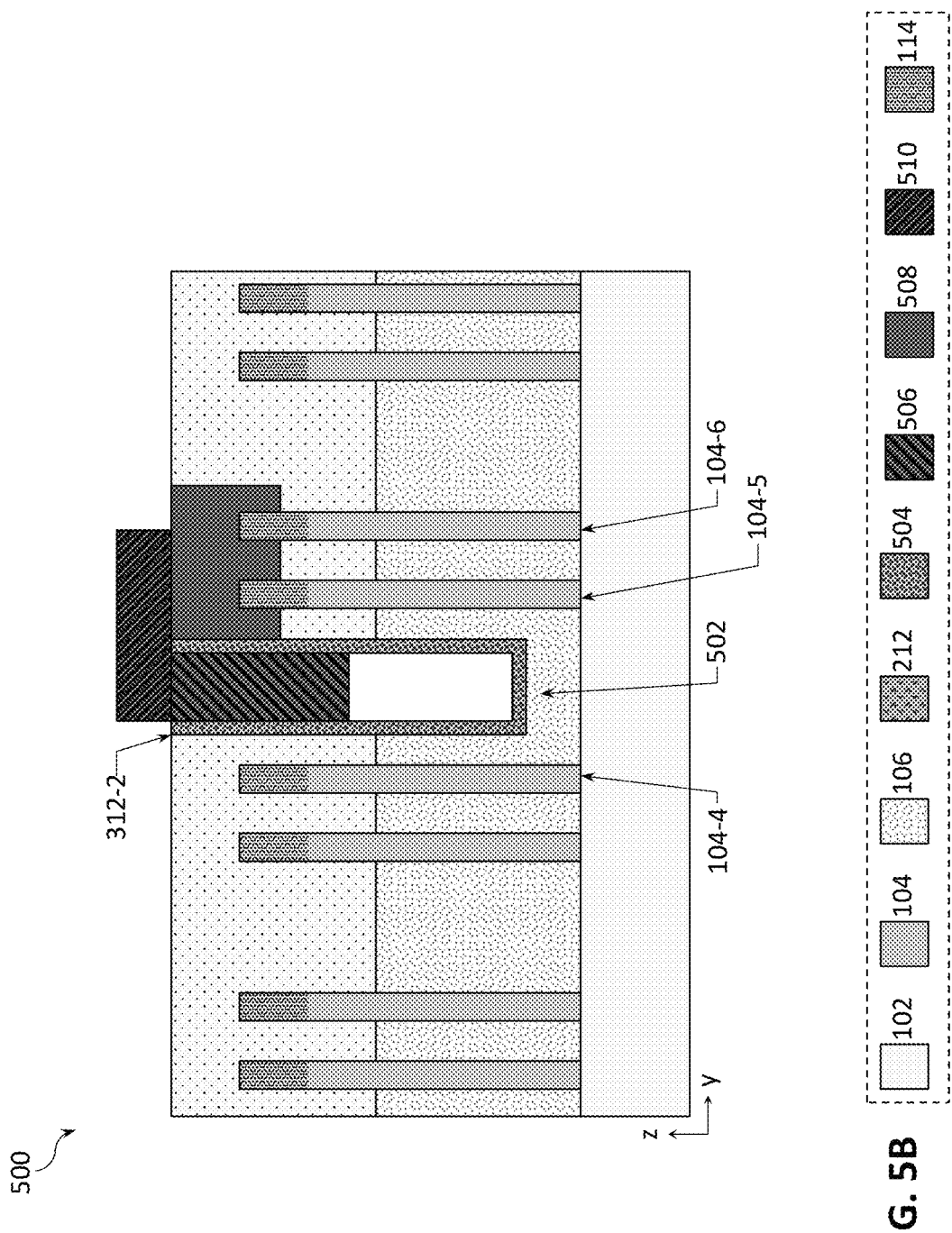
Figure 5C:
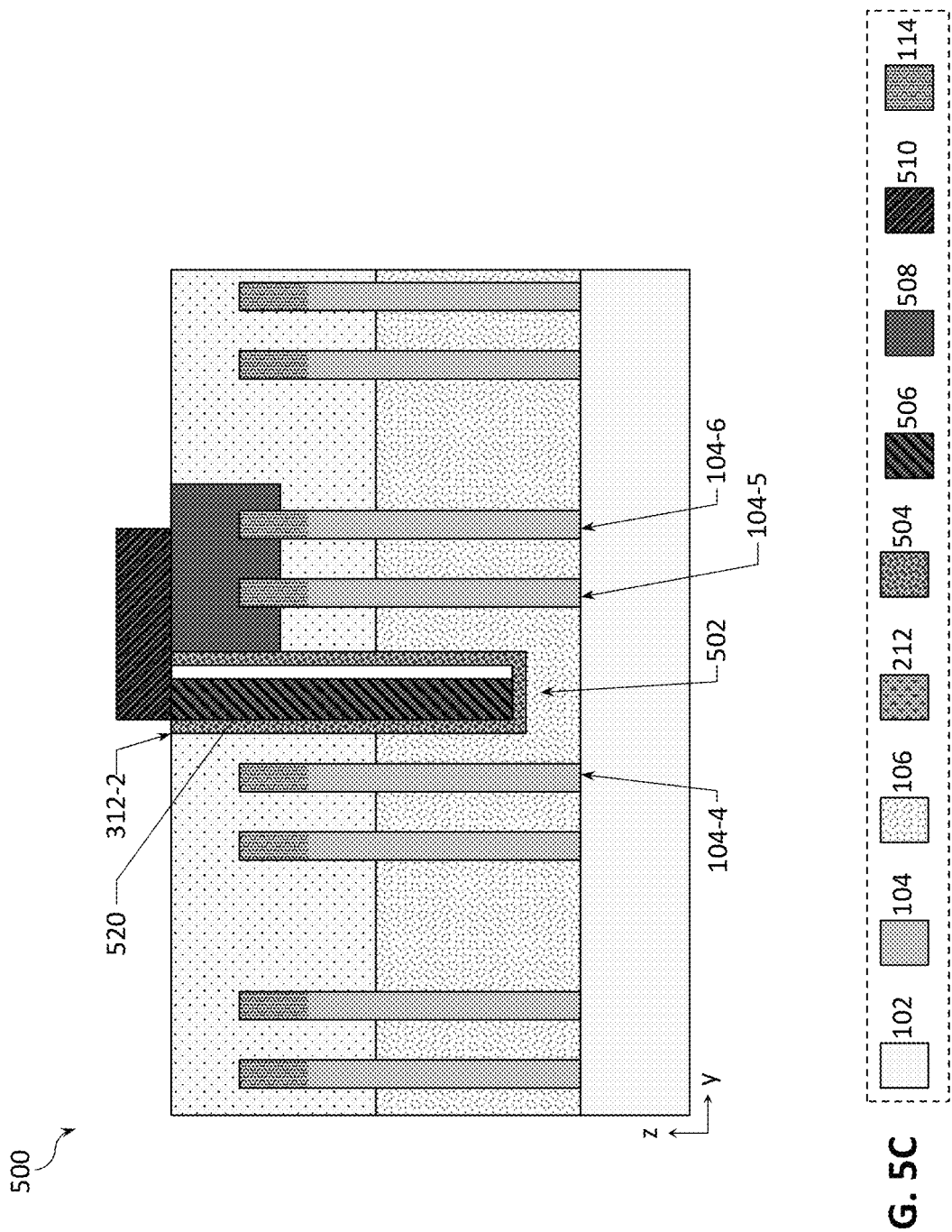
Figure 5D:
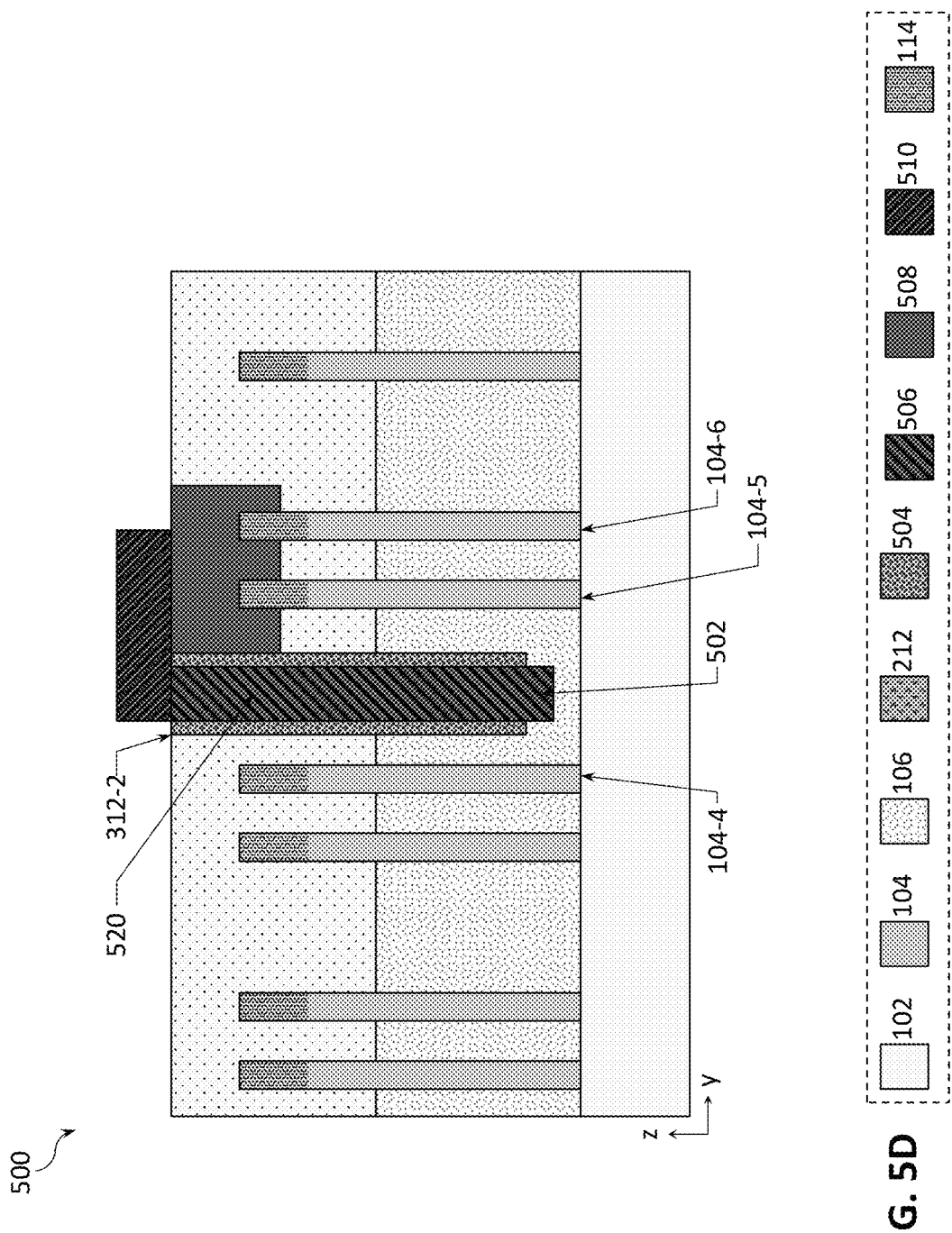

The embodiment of FIG. 5A illustrates that all of the opening for the power rail 502, lined with the dielectric liner 504, is filled with the one or more electrically conductive materials 506. In other embodiments, only a portion of the lined opening for the power rail 502 may be filled with the one or more electrically conductive materials 506, an example of which is shown in FIG. 5B. In some embodiments (additionally or alternatively to the partial filling of the opening for the power rail 502 as shown in FIG. 5B), the electrically conductive materials 506 filling the opening for the power rail 502 may be misaligned (or "not aligned") with respect to the dielectric liner 504, an example of which is shown in FIG. 5C. Furthermore, in some embodiments (additionally or alternatively to the partial filling of the opening for the power rail 50 as shown in FIGS. 5B and 5C), the electrically conductive materials 506 filling the opening for the power rail 502 may extend deeper than the dielectric liner 504 and may extend partially into the STI 106, an example of which is shown in FIG. 5D. The rest of the descriptions of FIG. 5A are applicable to FIGS. 5A-5D and, therefore, in the interests of brevity are not repeated.

Figure 5E:
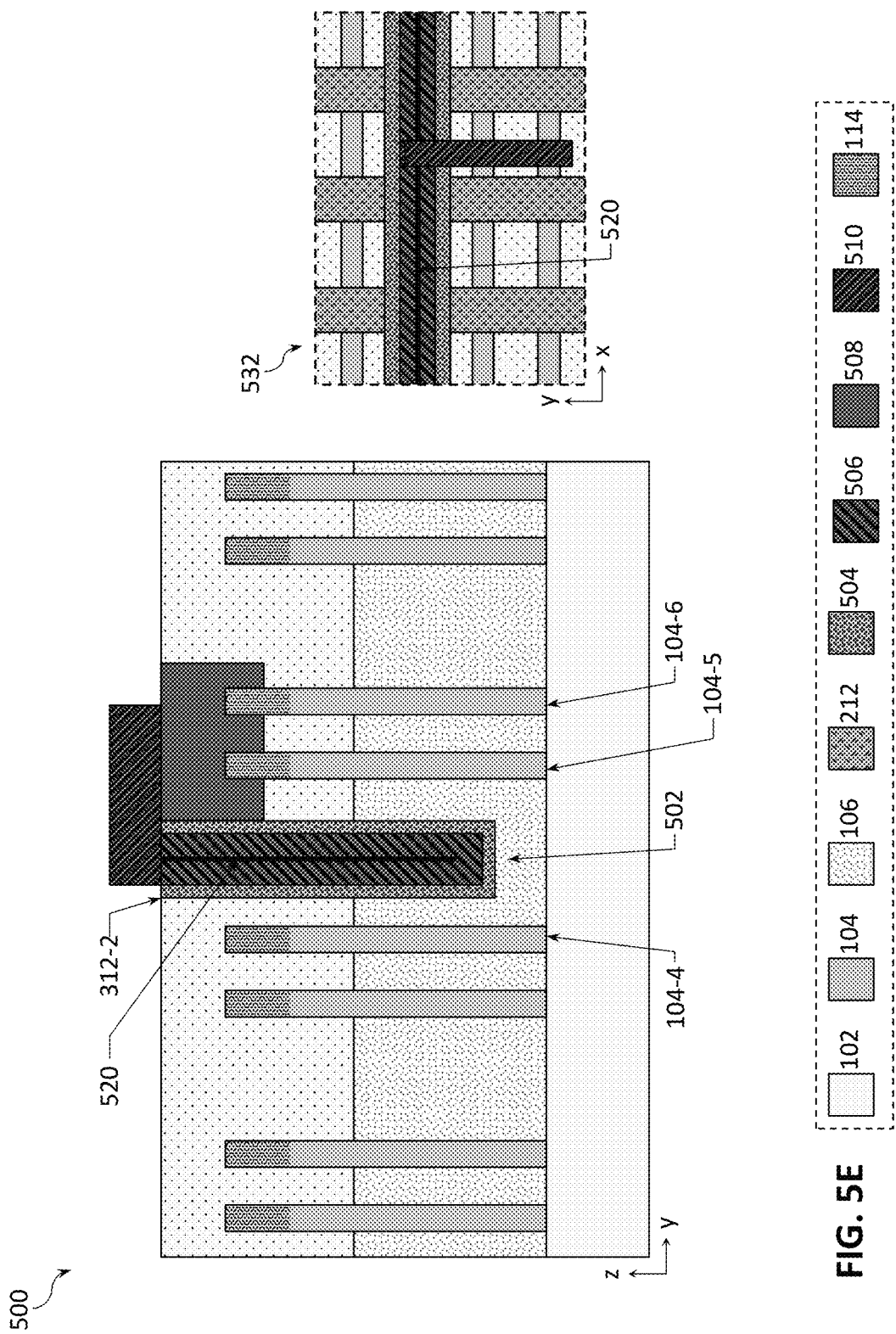

In some embodiments, the one or more electrically conductive materials 506 of the power rail 502 may also exhibit a characteristic seam substantially in the middle of the opening used to form the metal gate cut for the power rail 502, shown as a seam 520 in FIG. 5E. An inset 532 of FIG. 5E provides a top-down view illustrating the seam 520. Descriptions provided with respect to the seam 420 are applicable to the seam 520 and, therefore, in the interests of brevity are not repeated. Although not specifically shown in the drawings, in some embodiments, the partially filled power rail 502 such as the one shown in FIGS. 5B and 5C and the power rail 502 such as the one shown in FIG. 5D may also exhibit the seam 520 in the one or more electrically conductive materials 506. The rest of the descriptions of FIGS. 5A-5D are applicable to FIG. 5E and, therefore, in the interests of brevity are not repeated.

Fabrication Method

Figure 6:
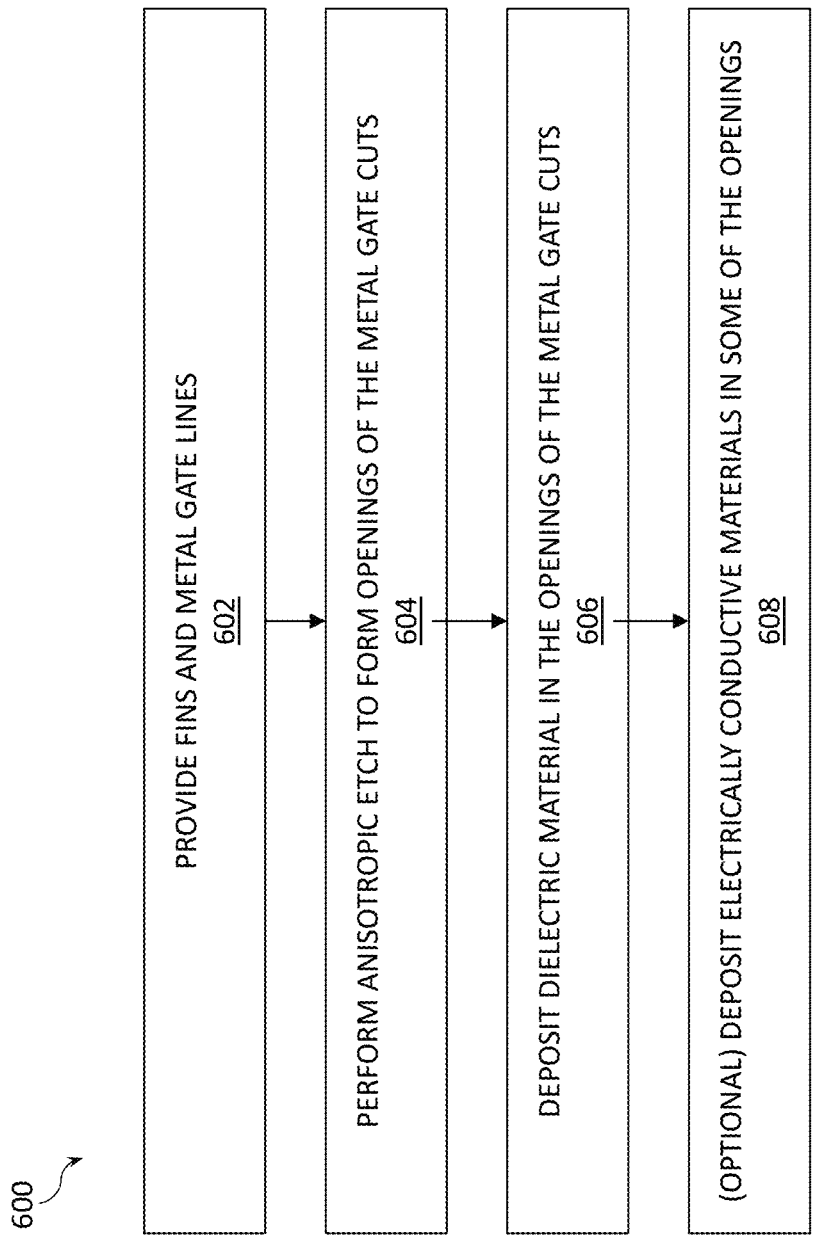
FIG. 6 is a flow diagram of an example method of manufacturing a transistor arrangement with one or more metal gate cuts or power rails in accordance with various embodiments of the present disclosure.

FIG. 6 is a flow diagram of an example method 600 of manufacturing a transistor arrangement with one or more metal gate cuts or power rails in accordance with various embodiments of the present disclosure.

Although the operations of the method 600 are illustrated once each and in a particular order, the operations may be performed in any suitable order and repeated as desired. For example, one or more operations may be performed in parallel to manufacture, substantially simultaneously, multiple transistor arrangements and/or multiple metal gate cuts or power rails as described herein. In another example, the operations may be performed in a different order to reflect the structure of a particular device assembly in which one or more metal gate cuts or power rails as described herein will be included.

In addition, the example manufacturing method 600 may include other operations not specifically shown in FIG. 6, such as various cleaning or planarization operations as known in the art. For example, in some embodiments, the base 102, as well as layers of various other materials subsequently deposited thereon, may be cleaned prior to, after, or during any of the processes of the method 600 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 600 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 600 may be illustrated with reference to the example embodiments shown in FIGS. 7A-7D, illustrating fabrication of the transistor arrangement 300 according to various embodiments described above, but the method 600 may be used to manufacture any suitable transistor arrangements having one or more metal gate cuts or power rails according to any embodiments of the present disclosure. FIGS. 7A-7D illustrate cross-sectional side views similar to the view shown in FIG. 4 (i.e., a cross-section along the plane AA of FIG. 3), in various example stages in the manufacture of an transistor arrangement using the method of FIG. 6 in accordance with some embodiments of the present disclosure.

Figure 7A:
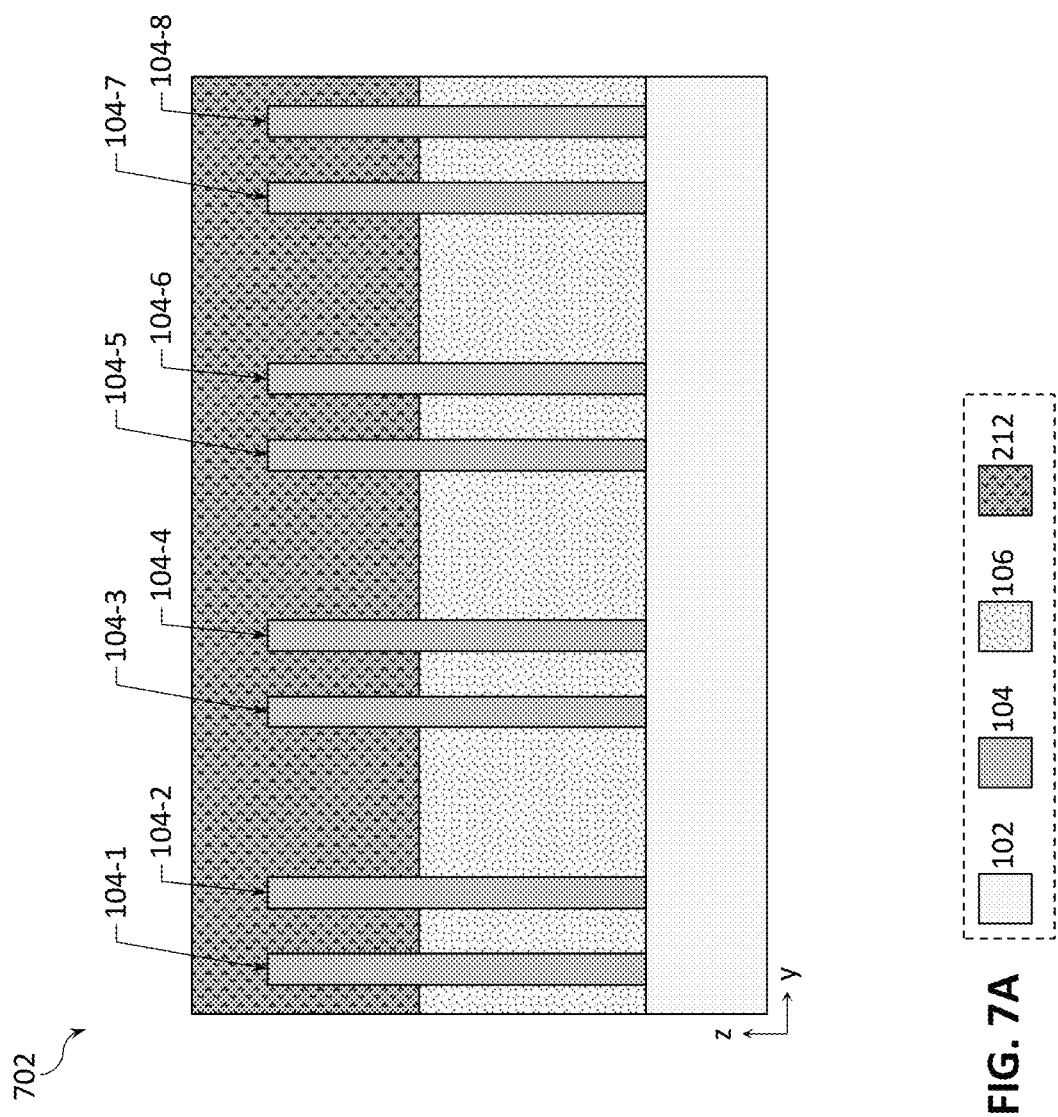
FIGS. 7A-7D are various views illustrating different example stages in the manufacture of a transistor arrangement with one or more metal gate cuts or power rails using the method of FIG. 6, according to some embodiments of the present disclosure.

The method 600 may begin with providing one or more (typically, a plurality) of fins over a base, and providing one or more (typically, a plurality) of metal gate lines as ridges crossing and wrapping around upper portions of the fins (process 602 shown in FIG. 6, a result of which is illustrated with an IC structure 702, shown in FIG. 7A). The IC structure 702 illustrates the base 102 and a plurality of fins 104 (namely, 8 fins 104-1 through 104-8, as described above) extending away from the base 102, with lower portions of the fins being enclosed by the STI 106, while the upper portions of the fins are enclosed by the gate electrode materials of the metal gate lines 212. The transistor arrangement 200 of FIG. 2 provides an example of a top-down view of the IC structure 702. In some embodiments, the process 602 may also include forming the S/D regions for various transistors of the fins 104. Methods for providing the fins 104 and the metal gate lines 212 are known in the art and, therefore, are not described here in detail.

Figure 7B:
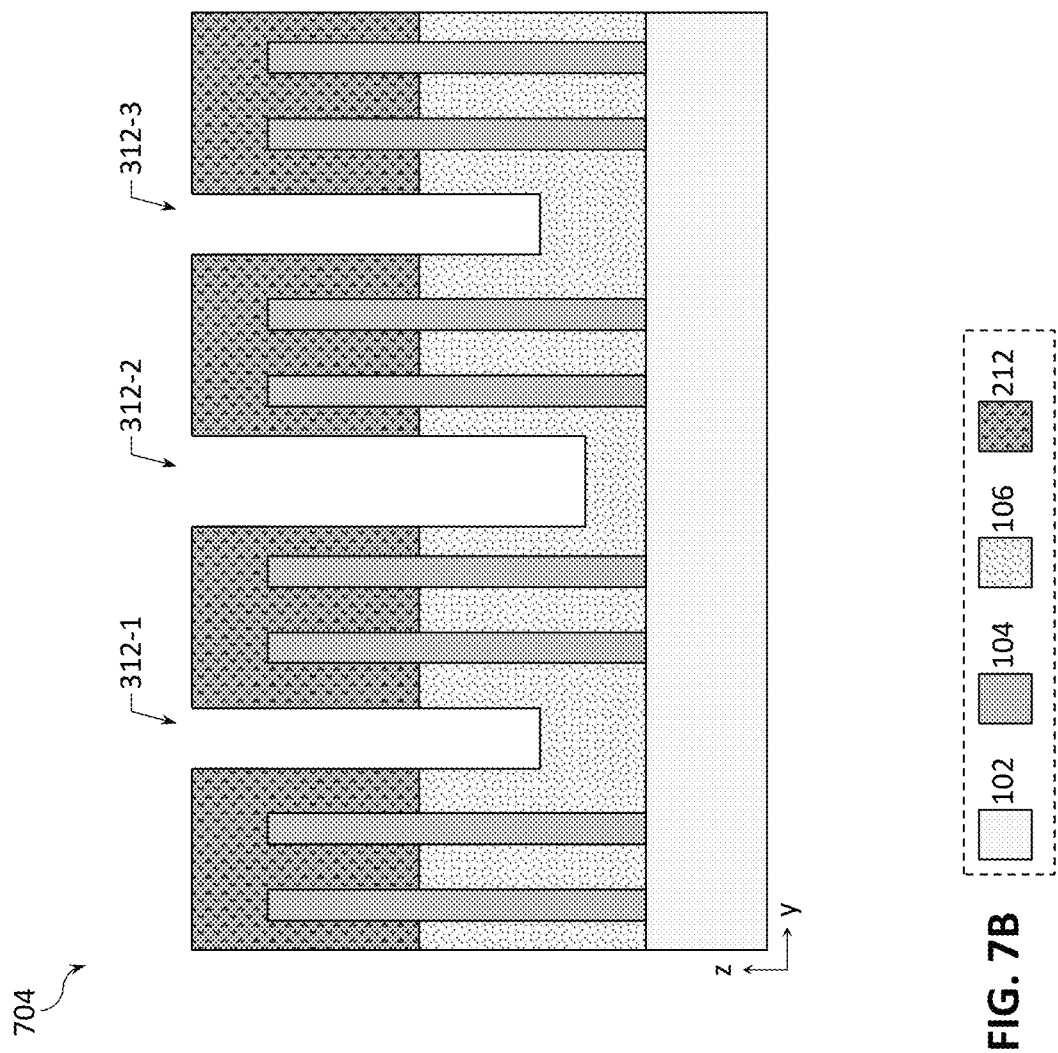

The method 600 may then proceed with performing an anisotropic etch to provide one or more (typically, a plurality) of openings for the metal gate cuts, the openings extending across one or more of the metal gate lines (process 604 shown in FIG. 6, a result of which is illustrated with an IC structure 704, shown in FIG. 7B). The IC structure 704 illustrates openings for the future metal gate cuts 312-1, 312-2, and 312-3 formed in the IC structure 702. Dimensions of the openings may be as discussed above with respect to dimensions of the metal gate cuts 312-1, 312-2, and 312-3. In some embodiments, the anisotropic etch of the process 604 may include an etch that uses etchants in a form of e.g., chemically active ionized gas (i.e., plasma) using e.g., bromine (Br) and chloride (Cl) based chemistries. In some embodiments, during the etch of the process 604, the IC structure may be heated to elevated temperatures, e.g., to temperatures between about room temperature and 200 degrees Celsius, including all values and ranges therein, to promote that byproducts of the etch are made sufficiently volatile to be removed from the surface. In some embodiments, the anisotropic etch of the process 604 may include a dry etch, such as radio frequency (RF) reactive ion etch (RIE) or inductively coupled plasma (ICP) RIE. Although not specifically shown in FIG. 7B, in various embodiments, any suitable patterning techniques may be used in the process 604 to define the locations and the dimensions of the openings for the metal gate cuts, such as, but not limited to, photolithographic or electron-beam (e-beam) patterning, possibly in conjunction with the use of one or more masks.

Figure 7C:
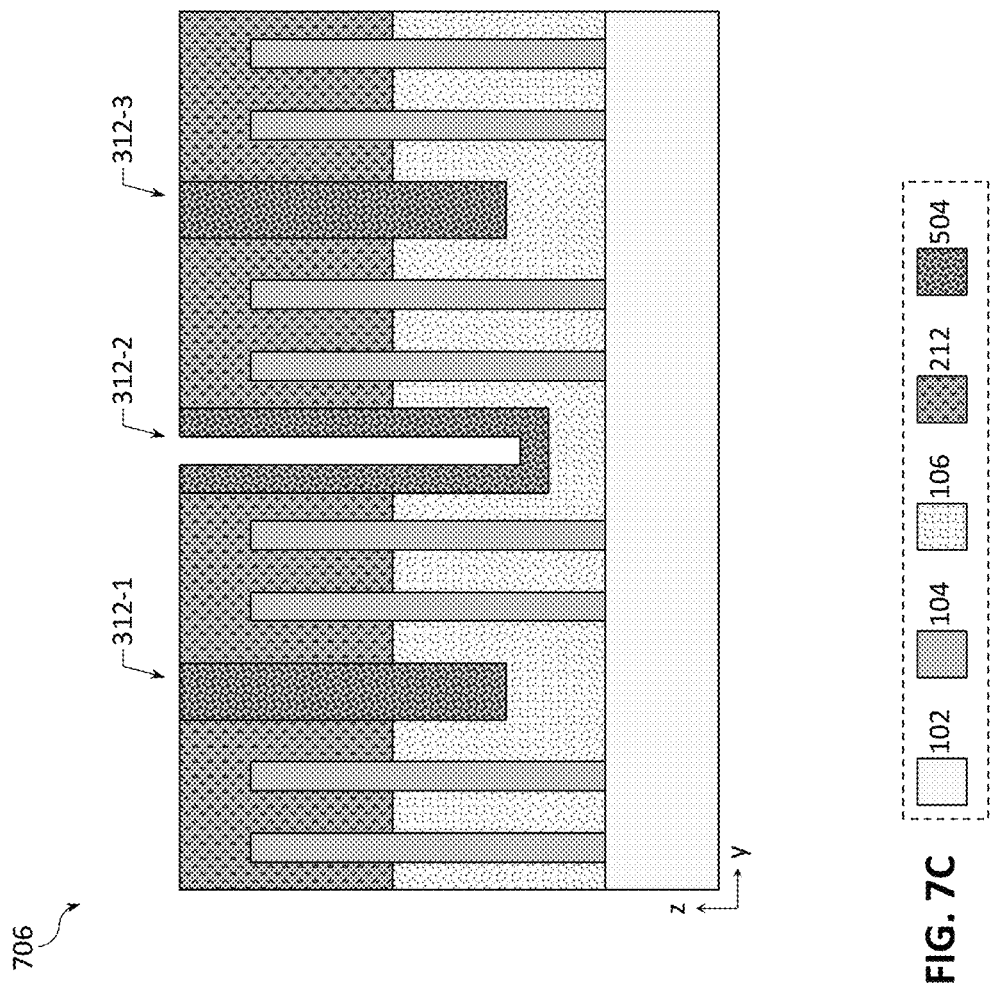

The method 600 may then proceed with depositing one or more dielectric materials in the openings formed in the process 604 (a process 606 shown in FIG. 6, a result of which is illustrated with an IC structure 706, shown in FIG. 7C). The IC structure 706 illustrates the openings for the metal gate cuts 312-1, 312-2, and 312-3 formed in the IC structure 704 now being lined, at their bottoms and the inner sidewalls, with the dielectric material 504. To provide such a lining, a conformal deposition technique such as ALD may be used to deposit the dielectric material 504. However, in other embodiments, any other suitable deposition techniques may be used to provide the dielectric material 504 within the openings of the metal gate cuts, such as spin-coating, dip-coating, physical vapor deposition (PVD) (e.g., evaporative deposition, magnetron sputtering, or e-beam deposition), or chemical vapor deposition (CVD). It should be noted that FIG. 7C illustrates an embodiment where the metal gate cuts 312-1 and 312-3 are fully filled with the dielectric material 504. This embodiment may be implemented in combination with any other embodiments of the transistor arrangement 300 described above. It should also be noted that, in other embodiments (not specifically shown in the drawings), the metal gate cuts 312-1 and 312-3 (i.e., the ones used to decouple the gates and not used as power rails) may be only partially filled with one or more dielectric materials, e.g., these openings may be only lined with the dielectric material 504 (e.g., similar to how the metal gate cut 312-2 is shown to be only lined with the material 504).

Figure 7D:
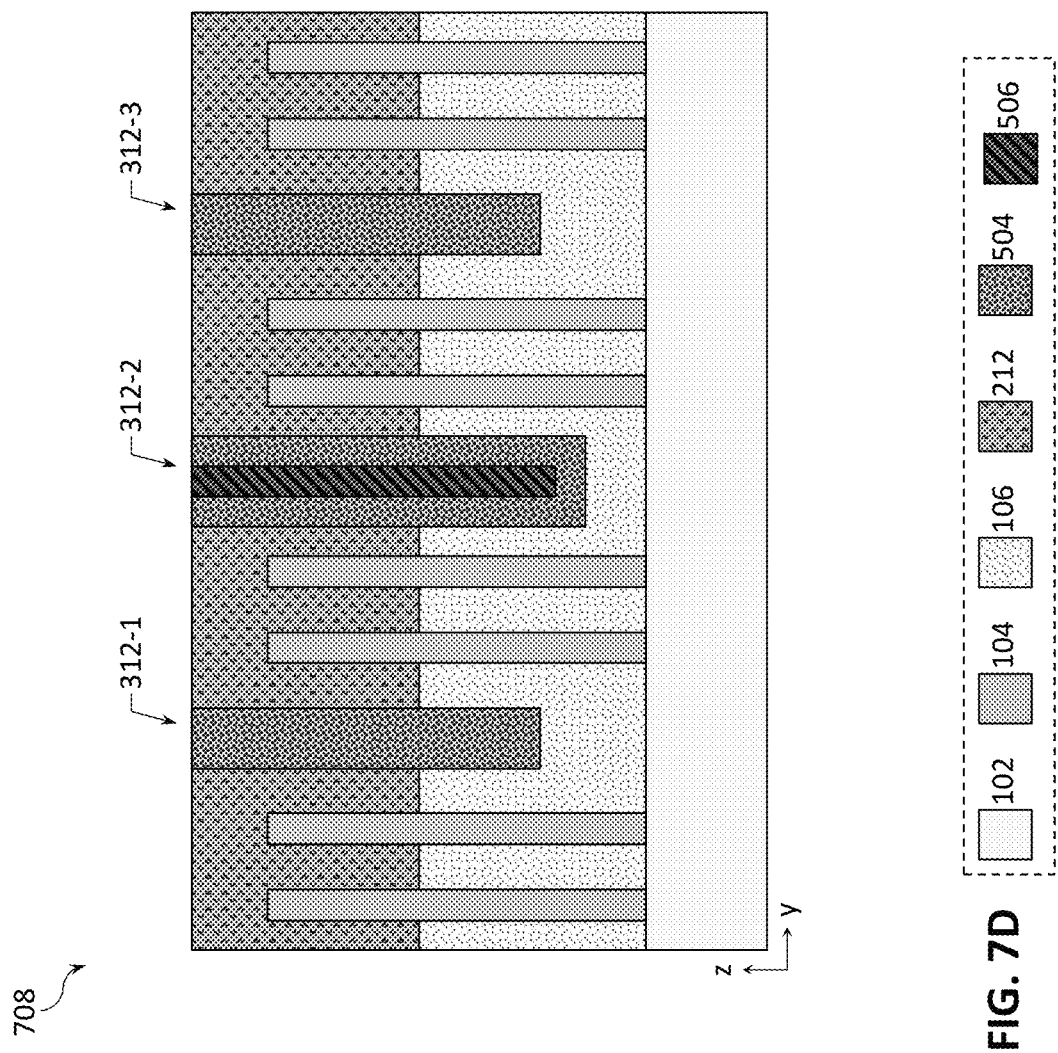

In the embodiments where a power rail is to be formed along with the metal gate cuts for decoupling the gates of transistors on adjacent fins, the method 600 may proceed with depositing one or more electrically conductive materials in the openings partially filled with the dielectric materials in the process 606 (a process 608 shown in FIG. 6, a result of which is illustrated with an IC structure 708, shown in FIG. 7D). The IC structure 708 illustrates the openings for the metal gate cut 312-2 of the IC structure 706 now being filled with the electrically conductive material 506. Examples of deposition techniques that may be used to the electrically conductive material 506 include, but are not limited to, ALD, PVD (including sputtering), CVD, or electroplating. Although not specifically shown in FIG. 7D, in various embodiments, any suitable patterning techniques, possibly in conjunction with the use of one or more masks, may be used in the process 608 to make sure that the metal gate cut 312-2 is filled with the electrically conductive material 506 while the metal gate cuts 312-1 and 312-3 are not filled.

Variations and Implementations

The transistor arrangements illustrated in FIGS. 1-7 do not represent an exhaustive set of assemblies in which one or more metal gate cuts and/or recessed power rails as described herein may be integrated, but merely provide examples of such arrangements. For example, while descriptions and drawings provided herein refer to FinFETs, these descriptions and drawings are equally applicable to embodiments any other non-planar FETs besides FinFETs, e.g., to nanoribbon transistors, nanowire transistors, or transistors such as nanoribbon/nanowire transistors but having transverse cross-sections of any geometry (e.g., oval, or a polygon with rounded corners). In another example, although particular arrangements of materials are discussed with reference to FIGS. 1-7, intermediate materials may be included in various portions of these drawings. Additionally, although some elements of the transistor arrangements are illustrated in FIGS. 1-7 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-7 may illustrate various elements, e.g., the metal gate cuts 312 or the S/D regions 114, as having perfectly straight sidewall profiles, i.e., profiles where the sidewalls extend perpendicularly to the base 102, these idealistic profiles may not always be achievable in real-world manufacturing processes. Namely, while designed to have straight sidewall profiles, real-world openings which may be formed as a part of fabricating various elements of the transistor arrangements illustrated in FIGS. 1-7 may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of integrating metal gate cuts and/or recessed power rails as provided herein are equally applicable to embodiments where various elements of such integrated structures look different from those shown in the drawings due to manufacturing processes used to form them.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the integration of one or more metal gate cuts and/or recessed power rails as described herein within a transistor arrangement.

Example Electronic Devices

Transistor arrangements with one or more metal gate cuts or power rails as disclosed herein may be included in any suitable electronic device. FIGS. 8-11 illustrate various examples of devices and components that may include one or more transistor arrangements with one or more metal gate cuts or power rails as disclosed herein.

Figures 8A, 8B:
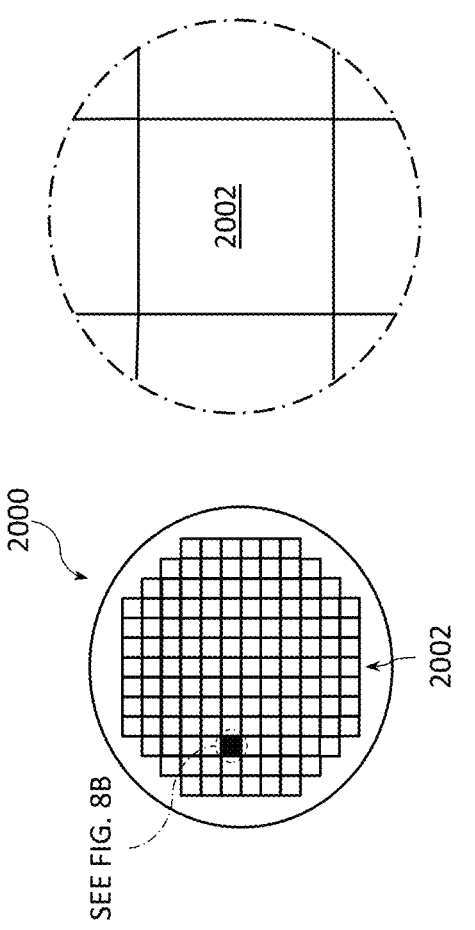
FIGS. 8A and 8B are top views of, respectively, a wafer and dies that may include one or more transistor arrangements with one or more metal gate cuts and/or recessed power rails in accordance with any of the embodiments disclosed herein.

FIGS. 8A-8B are top views of a wafer 2000 and dies 2002 that may include one or more transistor arrangements with one or more metal gate cuts or power rails in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 9. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more transistor arrangements with one or more metal gate cuts or power rails as described herein). After the fabrication of the semiconductor product is complete (e.g., after manufacture of one or more transistor arrangements with one or more metal gate cuts or power rails as described herein, e.g. any embodiment of the transistor arrangement 300 as described herein), the wafer 2000 may undergo a singulation process in which each of the dies 2002 is separated from one another to provide discrete "chips" of the semiconductor product. In particular, devices that include one or more transistor arrangements with one or more metal gate cuts or power rails as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a DRAM or an SRAM device), a logic device (e.g., an AND, OR, NAND, or NOR gate), or any other suitable circuit element. Multiple ones of these devices may be combined on a single die 2002.

Figure 9:
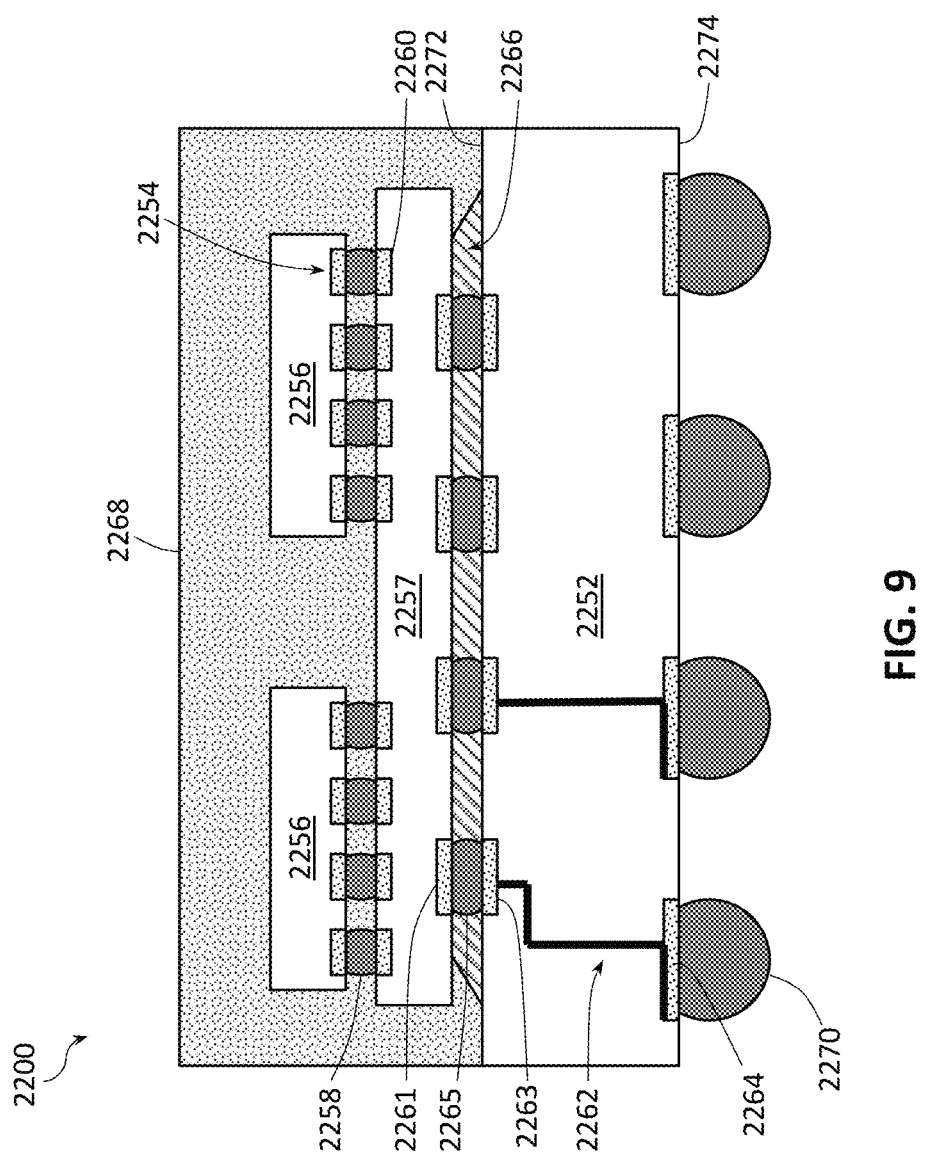
FIG. 9 is a cross-sectional side view of an IC package that may include one or more transistor arrangements with one or more metal gate cuts and/or recessed power rails in accordance with any of the embodiments disclosed herein.

FIG. 9 is a side, cross-sectional view of an example IC package 2200 that may include one or more transistor arrangements with one or more metal gate cuts or power rails in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 9 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 9 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 9 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 10.

The dies 2256 may take the form of any of the embodiments of the die 2002 discussed herein (e.g., may include any of the embodiments of the transistor arrangements with one or more metal gate cuts or power rails as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more transistor arrangements with one or more metal gate cuts or power rails, e.g., as discussed above; in some embodiments, at least some of the dies 2256 may not include any transistor arrangements with one or more metal gate cuts or power rails.

The IC package 2200 illustrated in FIG. 9 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 9, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 10:
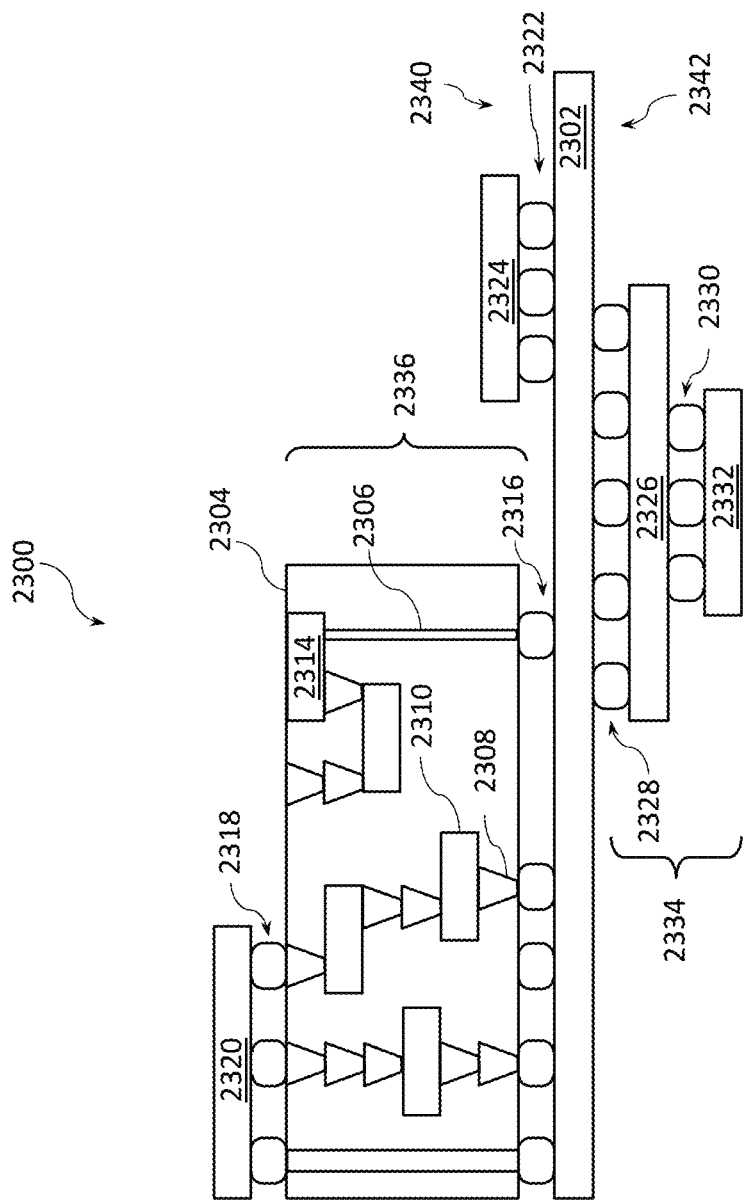
FIG. 10 is a cross-sectional side view of an IC device assembly that may include one or more transistor arrangements with one or more metal gate cuts and/or recessed power rails in accordance with any of the embodiments disclosed herein.

FIG. 10 is a cross-sectional side view of an IC device assembly 2300 that may include components having one or more transistor arrangements with one or more metal gate cuts or power rails in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more transistor arrangements with one or more metal gate cuts or power rails in accordance with any of the embodiments disclosed herein; e.g., any of the IC packages discussed below with reference to the IC device assembly 2300 may take the form of any of the embodiments of the IC package 2200 discussed above with reference to FIG. 9 (e.g., may include one or more transistor arrangements with one or more metal gate cuts or power rails provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 10 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 10), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 8B), an IC device, or any other suitable component. In particular, the IC package 2320 may include one or more transistor arrangements with one or more metal gate cuts or power rails as described herein. Although a single IC package 2320 is shown in FIG. 10, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 10, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 10 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 11:
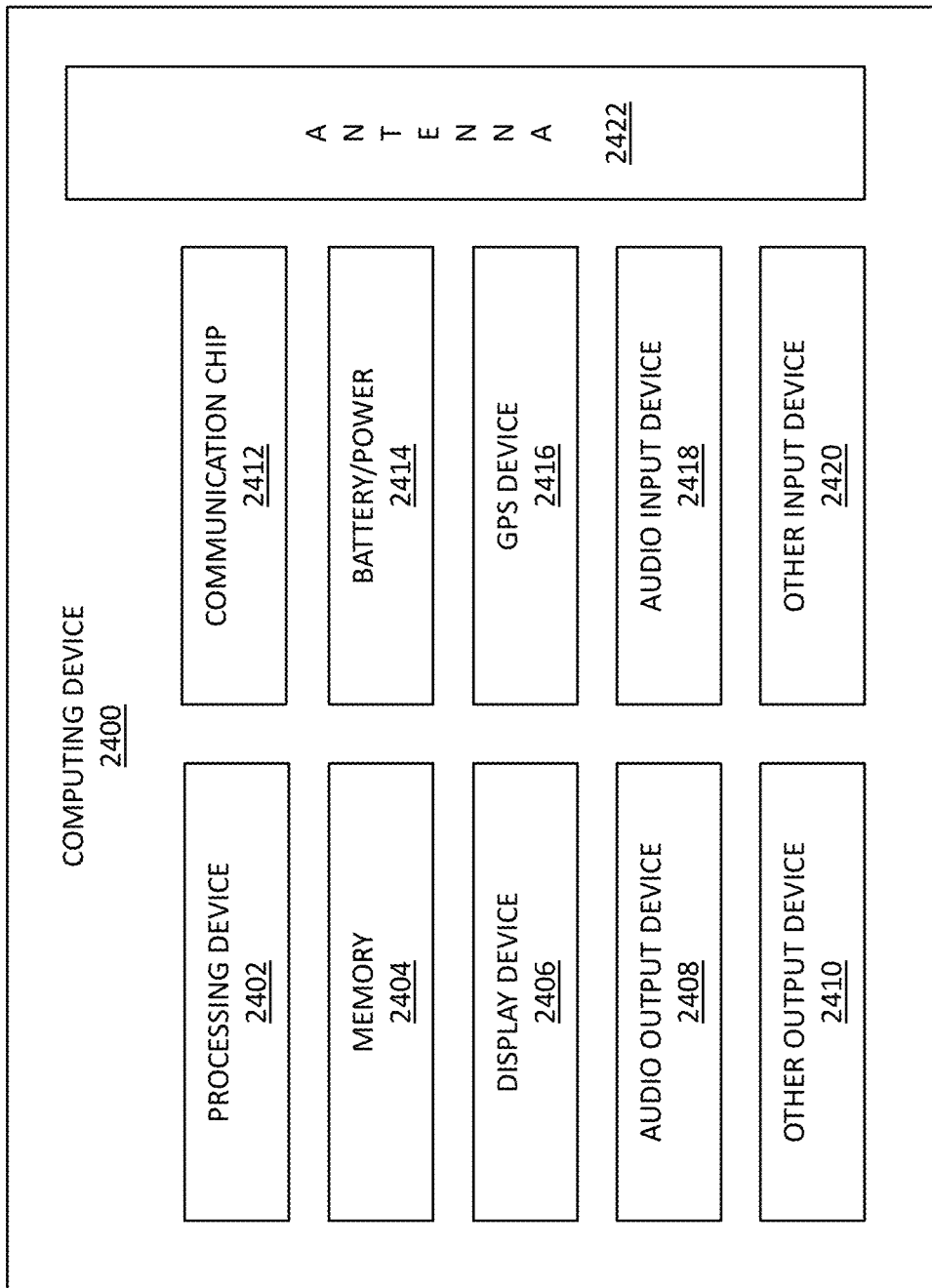
FIG. 11 is a block diagram of an example computing device that may include one or more transistor arrangements with one or more metal gate cuts and/or recessed power rails in accordance with any of the embodiments disclosed herein.

FIG. 11 is a block diagram of an example computing device 2400 that may include one or more components with one or more transistor arrangements with one or more metal gate cuts or power rails in accordance with any of the embodiments disclosed herein. For example, any suitable ones of the components of the computing device 2400 may include a die (e.g., the die 2002 (FIG. 8B)) including one or more transistor arrangements with one or more metal gate cuts or power rails in accordance with any of the embodiments disclosed herein. Any of the components of the computing device 2400 may include an IC package 2200 (FIG. 9). Any of the components of the computing device 2400 may include an IC device assembly 2300 (FIG. 10).

A number of components are illustrated in FIG. 11 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 11, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides a transistor arrangement (or, more generally, an IC device) that includes a base (e.g., a support structure such as a substrate, a chip, or a wafer); a first fin, extending away from the base; a second fin, extending away from the base, where each of the first and the second fin includes one or more semiconductor materials (where, in various embodiments, the material composition of the one or more semiconductor materials of the first fin may be the same or different from the material composition of the one or more semiconductor materials of the second fin). The transistor arrangement further includes a gate electrode material having a first portion that at least partially wraps around an end of the first fin that is farthest away from the base (i.e., wrapping around the upper portion of the first fin), and a second portion that at least partially wraps around an end of the second fin that is farthest away from the base (i.e., wrapping around the upper portion of the second fin). The transistor arrangement also includes an opening in the gate electrode material between the first portion and the second portion, the opening at least partially filled with one or more dielectric materials, where a distance from the base to the opening is at least 5 nanometers smaller than a distance from the base to the gate electrode material. In other words, the opening extends further towards the base than the gate electrode material, e.g., at least 5 nanometers further.

Example 2 provides the transistor arrangement according to example 1, where the one or more dielectric materials are in contact with the gate electrode material, e.g., with the workfunction material (e.g., with a gate metal material specifically intended to modulate the gate electrode workfunction). In such an example, there are no high-k gate dielectrics or any capping metals in between, as would have been the case with conventional polygate cuts.

Example 3 provides the transistor arrangement according to example 2, where a portion of the first fin that is closest to the base and a portion of the second fin that is closest to the base is surrounded by an STI material, and the one or more dielectric materials are in contact with the STI electrode material (thus, the opening extends into the STI material, which is in contrast to conventional polygate cuts that would normally end at the interface between the gate stack and the STI material due to the selective etching process used to create such cuts).

Example 4 provides the transistor arrangement according to any one of the preceding examples, where the first portion of the gate electrode material forms a gate terminal of a first transistor, the transistor further includes a further gate electrode material wrapping a further portion of the end of the first fin that is farthest away from the base, the further gate electrode material forming a gate terminal of a second transistor, and in a direction of a longitudinal axis of the first fin, the opening extends to at least about 30%, e.g., at least about 40% or at least about 50%, of a distance between the gate terminal of the first transistor and the gate terminal of the second transistor.

Example 5 provides the transistor arrangement according to example 4, where a length of the opening in the direction of the longitudinal axis of the first fin is substantially equal to a pitch (e.g., a center-to-center distance) between the gate terminal of the first transistor and the gate terminal of the second transistor.

Example 6 provides the transistor arrangement according to examples 4 or 5, where the opening includes a seam, the seam extending in a plane substantially parallel to each of the first fin and the second fin.

In a further example according to any one of the preceding examples, a distance between the first fin and the second fin may be between about 10 and 200 nanometers, including all values and ranges therein, e.g., between about 20 and 75 nanometers, or between about 30 and 50 nanometers.

In a further example according to any one of the preceding examples, an aspect ratio of the opening (i.e., a ratio of the depth of the opening to the width of the opening) may be between about 2 and 30, including all values and ranges therein, e.g., between about 2 and 20, or between about 5 and 15.

Example 7 provides the transistor arrangement according to any one of the preceding examples, where the opening is a first opening, the transistor arrangement further includes a third fin, extending away from the base, where the second fin is between the first fin and the third fin, and where the gate electrode material has a third portion that at least partially wraps around an end of the third fin that is farthest away from the base (i.e., wrapping around the upper portion of the third fin), and a second opening in the gate electrode material between the second portion and the third portion, where the second opening is partially filled with the one or more dielectric materials and partially filled with one or more electrically conductive materials, and where the one or more electrically conductive materials are electrically separated from the second and third portions of the gate electrode material by the one or more dielectric materials filling the opening.

Example 8 provides the transistor arrangement according to example 7, where an aspect ratio of the second opening is between about 2 and 15, including all values and ranges therein, e.g., between about 2 and 10, or between about 3 and 8.

Example 9 provides the transistor arrangement according to examples 7 or 8, where an aspect ratio of the second opening is equal or smaller than an aspect ratio of the first opening.

Example 10 provides the transistor arrangement according to any one of examples 7-9, where a distance from the base to the second opening is smaller than the distance from the base to the first opening, e.g., at least about 5 nm smaller, including all values and ranges therein, e.g., at least about 10 nm smaller or at least about 20 nm smaller.

Example 11 provides the transistor arrangement according to any one of examples 7-10, where the second opening is lined with a dielectric liner, the one or more electrically conductive materials at least partially fill the second opening lined with the dielectric liner, and the dielectric liner includes at least one of the one or more dielectric materials that at least partially fill the first opening.

Example 12 provides the transistor arrangement according to any one of examples 7-11, where the one or more electrically conductive materials at least partially fill a first portion of the second opening, the second opening further includes a second portion, at least partially filled with one or more dielectric materials, and the second portion is closer to the base than the first portion.

Example 13 provides the transistor arrangement according to any one of examples 7-14, further including a structure of one or more electrically conductive material, the structure configured to provide electrical coupling between the one or more electrically conductive materials in the second opening and at least one transistor terminal of a transistor in one of the first fin, the second fin, or the third fin.

Example 14 provides the transistor arrangement according to example 13, where the at least one transistor terminal is a source terminal or a drain terminal.

Example 15 provides a transistor arrangement that includes a fin, extending away from a base (e.g., a substrate, a wafer, a chip, or a die), the fin including one or more semiconductor materials that form a channel region of a transistor; one or more dielectric materials surrounding a first portion of the fin; one or more gate electrode materials, surrounding and enclosing a second portion of the fin, where the first portion of the fin is closer to the base than the second portion of the fin, and the second portion includes an edge of the fin that is opposite the base (i.e., the first portion is the lower portion of the fin and the second portion is the upper portion of the fin); and an opening extending through the one or more gate electrode materials and into the one or more dielectric materials surrounding the first portion of the fin, the opening at least partially filled with one or more electrically conductive materials, the one or more electrically conductive materials configured to provide power or signals to at least one terminal of the transistor.

Example 16 provides the transistor arrangement according to example 15, where the one or more gate electrode materials are shaped as a ridge, substantially perpendicular to the length of the fin and enclosing the second portion of the fin, the ridge is one of a plurality of ridges of the one or more gate electrode materials, surrounded by dielectric material, each of the plurality of ridges provided over a different area of the second portion of the fin, and the opening extends through two or more of the plurality of ridges.

Example 17 provides the transistor arrangement according to examples 15 or 16, where the opening includes a liner of one or more dielectric materials at a bottom and inner sidewalls of the opening, and the one or more electrically conductive materials fill the opening lined with the liner.

Example 18 provides the transistor arrangement according to any one of examples 15-17, where the one or more electrically conductive materials at least partially fill a first portion of the opening, the opening further includes a second portion, at least partially filled with one or more dielectric materials, and the second portion is closer to the base than the first portion.

Example 19 provides a method of forming a transistor arrangement, the method including: providing a fin of one or more semiconductor materials, the fin extending away from a base; providing a layer of one or more dielectric materials surrounding lower portions of the fin; providing a ridge of one or more gate electrode materials surrounding and enclosing a second portion of the fin, where the first portion of the fin is closer to the base than the second portion of the fin, and the second portion includes an edge of the fin that is opposite the base; performing an anisotropic etch to form, substantially simultaneously, a first opening and a second opening, where the first opening extends through a first portion of the ridge and into a first portion of the layer of one or more dielectric materials around the ridge by a first distance, the second opening extends through a second portion of the ridge and into a second portion of the layer of one or more dielectric materials around the ridge by a second distance, a width of the first opening is smaller than a width of the second opening, and the first distance is smaller than the second distance; depositing one or more dielectric materials into the first opening and the second opening; and depositing one or more electrically conductive into the second opening after the one or more dielectric materials have been deposited into the second opening.

Example 20 provides the method according to example 19, where the one or more dielectric materials substantially fill the first opening, the one or more dielectric materials form a liner in the second opening, and the one or more electrically conductive materials are deposited into the second opening where the one or more dielectric materials separate the one or more electrically conductive materials from the one or more gate electrode materials.

Example 21 provides an IC package that includes an IC die, the IC die including the transistor arrangement according to any one of the preceding examples (e.g., any one of examples 1-18), and a further IC component, coupled to the IC die.

Example 22 provides the IC package according to example 21, where the further IC component includes one of a package substrate, an interposer, or a further IC die.

Example 23 provides an electronic device that includes a carrier substrate and an IC die coupled to the carrier substrate. The IC die includes the transistor arrangement according to any one of examples 1-18, and/or is included in the IC package according to any one of examples 21-22.

Example 24 provides the electronic device according to example 23, where the computing device is a wearable or handheld electronic device.

Example 25 provides the electronic device according to examples 23 or 24, where the electronic device further includes one or more communication chips and an antenna.

Example 26 provides the electronic device according to any one of examples 23-25, where the carrier substrate is a motherboard.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:
1. An integrated circuit (IC) device, comprising:
a first fin, extending away from a base;
a second fin, extending away from the base, where each of the first and the second fin includes one or more semiconductor materials;
a third fin, extending away from the base, where the second fin is between the first fin and the third fin;
a gate electrode material, comprising:

a first portion that at least partially wraps around an upper portion of the first fin,
a second portion that at least partially wraps around an upper portion of the second fin, and
a third portion that at least partially wraps around an upper portion of the third fin; and
a first opening in the gate electrode material between the first portion and the second portion, the first opening at least partially filled with one or more dielectric materials and no electrically conductive materials and extending closer to the base than the gate electrode material; and
a second opening in the gate electrode material between the second portion and the third portion, wherein the second opening includes a single layer of a dielectric liner on sidewalls of the second opening, is at least partially filled with one or more electrically conductive materials, extends closer to the base than the first opening, and is wider than the first opening in a direction that is parallel to the base and perpendicular to a longitudinal axis of the first fin, and wherein the dielectric liner includes the one or more dielectric materials.

2. The IC device according to claim 1, wherein the one or more dielectric materials are in contact with the gate electrode material.

3. The IC device according to claim 2, wherein:
a portion of the first fin that is closest to the base and a portion of the second fin that is closest to the base is surrounded by a shallow trench insulator (STI) material, and
the one or more dielectric materials are in contact with the STI material.

4. The IC device according to claim 1, wherein:
the first portion of the gate electrode material forms a gate terminal of a first transistor,
the IC device further includes a further gate electrode material wrapping a further portion of the upper portion of the first fin, the further gate electrode material forming a gate terminal of a second transistor, and
in a direction of the longitudinal axis of the first fin, the first opening extends to at least 30% of a distance between the gate terminal of the first transistor and the gate terminal of the second transistor.

5. The IC device according to claim 4, wherein a length of the first opening in the direction of the longitudinal axis of the first fin is substantially equal to a pitch between the gate terminal of the first transistor and the gate terminal of the second transistor.

6. The IC device according to claim 4, wherein the first opening includes a seam, the seam extending in a plane substantially parallel to the longitudinal axis of the first fin.

7. The IC device according to claim 1, wherein an aspect ratio of the second opening is equal or smaller than an aspect ratio of the first opening.

8. The IC device according to claim 1, further comprising a structure of one or more electrically conductive material, the structure configured to provide electrical coupling between the one or more electrically conductive materials in the second opening and at least one transistor terminal of a transistor in one of the first fin, the second fin, or the third fin.

9. The IC device according to claim 8, wherein the at least one transistor terminal is a source terminal or a drain terminal.

10. The IC device according to claim 1, wherein:
the IC device is an IC package that includes an IC die and a further component, coupled to the IC die, and
the IC die includes the first, second, and third fins, the gate electrode material, the first opening, and the second opening.

11. The IC device according to claim 10, wherein the further IC component is one of a carrier substrate, a package substrate, an interposer, or a further IC die.

12. An integrated circuit (IC) device, comprising:
a first fin, extending away from a base;
a second fin, extending away from the base, where each of the first and the second fin includes one or more semiconductor materials;
a gate electrode material having a first portion that at least partially wraps around an upper portion of the first fin and a second portion that at least partially wraps around an upper portion of the second fin;
a further gate electrode material having a portion that at least partially wraps around a further portion of the upper portion of the first fin;
an insulator material surrounding a lower portion of the first fin and a lower portion of the second fin;
a first opening having a portion in the gate electrode material between the first portion and the second portion, the first opening at least partially filled with one or more dielectric materials to electrically isolate the first portion and the second portion of the gate electrode material from one another; and
a second opening extending through the gate electrode material and the further gate electrode material and into the insulator material, wherein a single layer of a dielectric liner is on sidewalls of the second opening, a material composition of the dielectric liner is substantially same as a material composition of the one or more dielectric materials, and the second opening is at least partially filled with one or more electrically conductive materials,
wherein the first portion of the gate electrode material forms a gate terminal of a first transistor, the portion of the further gate electrode material forms a gate terminal of a second transistor, and, in a direction of a longitudinal axis of the first fin, the first opening extends to at least 30% but less than 100% of a distance between the gate terminal of the first transistor and the gate terminal of the second transistor.

13. The IC device according to claim 12, wherein:
the IC device is an IC package that includes an IC die and a further component, coupled to the IC die, and
the IC die includes the first and second fins, the gate electrode material, the further gate electrode material, and the opening.

14. The IC device according to claim 13, wherein the further IC component is one of a carrier substrate, a package substrate, an interposer, or a further IC die.

15. The IC device according to claim 12, wherein the dielectric liner is in contact with the gate electrode material of the first portion and with the gate electrode material of the second portion.

16. The IC device according to claim 1, wherein material compositions of the dielectric liner on the sidewalls of the second opening and the one or more dielectric materials at least partially filling the first opening are substantially same.

17. The IC device according to claim 1, wherein the dielectric liner is in contact with the gate electrode material of the first portion and with the gate electrode material of the second portion.

18. The IC device according to claim 1, wherein the one or more electrically conductive materials at least partially filling the second opening extend closer to the base than the dielectric liner.

19. The IC device according to claim 1, further comprising:
- a further electrically conductive material, at least partially wrapping around a further upper portion of the second fin or a further upper portion of the third fin; and
- a conductive line, comprising:
    - a first portion in conductive contact with the one or more electrically conductive materials in the second opening, and
    - a second portion in conductive contact with the further electrically conductive material.

20. The IC device according to claim 19, wherein the one or more electrically conductive materials at least partially filling the second opening extend closer to the base than the dielectric liner.

\* \* \* \* \*